(12) United States Patent
Nicholson

(10) Patent No.: US 10,840,853 B2
(45) Date of Patent: Nov. 17, 2020

(54) LOW PHASE NOISE OSCILLATOR USING NEGATIVE FEEDBACK

(71) Applicant: Keysight Technologies, Inc., Santa Rosa, CA (US)

(72) Inventor: Dean Nicholson, Windsor, CA (US)

(73) Assignee: Keysight Technologies, Inc., Santa Rosa, CA (US)

( * ) Notice: Subject to any disclaimer, the term of this patent is extended or adjusted under 35 U.S.C. 154(b) by 0 days.

(21) Appl. No.: 16/285,525

(22) Filed: Feb. 26, 2019

(65) Prior Publication Data

US 2020/0274490 A1    Aug. 27, 2020

(51) Int. Cl.
*H03B 5/18* (2006.01)
*H03B 9/14* (2006.01)
*H03L 7/04* (2006.01)

(52) U.S. Cl.
CPC ......... *H03B 5/1864* (2013.01); *H03B 5/1823* (2013.01); *H03L 7/04* (2013.01); *H03B 2200/0088* (2013.01); *H03B 2202/076* (2013.01)

(58) Field of Classification Search
CPC ............... H03B 5/1864; H03B 5/1823; H03B 2202/076; H03B 2200/0088; H03L 7/04
USPC ............................................. 331/107 SL, 154
See application file for complete search history.

(56) References Cited

U.S. PATENT DOCUMENTS

| 3,778,648 | A | 12/1973 | Kawada |
| 3,891,934 | A | 6/1975 | Norton et al. |
| 4,536,721 | A | 8/1985 | Charbonnier |
| 5,036,299 | A | 7/1991 | Dick et al. |
| 9,350,293 | B1 | 5/2016 | Desrochers, II et al. |
| 2011/0193641 | A1* | 8/2011 | Clark ..................... H03B 5/326 331/108 R |

OTHER PUBLICATIONS

Advisory Action dated Mar. 8, 2019 from U.S. Appl. No. 15/285,033, 3 pgs.
David G. Santiago et al., "Closed Loop Tests of The NASA Sapphire Phase Stabilizer", 1993 IEEE International Frequency Control Symposium, Jun. 2-4, 1993, pp. 774-778.
D.P .Tsarapkin, "An Uncooled Microwave Oscillator With 1-Million Effective Q-Factor", 1993 IEEE International Frequency Control Symposium, Jun. 2-4, 1993, pp. 779-783.
Y. Leblebici et al., "Fundamentals of High Frequency CMOS Analog Integrated Circuits", 2009, downloaded from the internet at cambridge.org/us/files/8113/6680/1480/Section_4-6-7.pdf no later than Jan. 16, 2019, pp. 1-15.
Applicant Interview Summary dated Mar. 13, 2019 from U.S. Appl. No. 15/285,033, 3 pgs.
Non-Final Office Action dated Jun. 10, 2019 from U.S. Appl. No. 15/285,033, 9 pgs.

* cited by examiner

*Primary Examiner* — Richard Tan

(57) ABSTRACT

An oscillator includes a resonator and a first loop circuit. The first loop circuit includes an amplifier and a first coupler. That first loop circuit is electrically coupled to the resonator. The oscillator is configured to produce negative feedback for the amplifier in a cavity mode relative to short circuit terminations or open circuit terminations of a cavity modelling the oscillator at frequencies offset from a carrier frequency. The oscillator has a loss of less than 4.00 dB for a bidirectional trip through the cavity at the frequencies offset from the carrier frequency.

20 Claims, 18 Drawing Sheets

LOW PHASE NOISE OSCILLATOR USING NEGATIVE FEEDBACK

BACKGROUND

Leeson's Rule is used to design radio frequency (RF) oscillators with low phase noise. Leeson's Rule describes output phase noise spectra as an equation. As expressed in a single sideband form, Leeson's Rule is given as:

$$L(f) = 10\ \log_{10}[(FKT/2P_{sav})*(1+f_o/(2Q_L*\Delta f))^2]\text{dBc/Hz},$$

wherein:

L(f)=single sideband phase noise (dBc/Hz)
F=Noise Figure of the active device in the oscillator (dB)
K=Boltzmann's constant=$1.38 \times 10^{-23}$ Joules/degree-K
T=Temperature of the active device, usually assumed to be 17° C. (290° K.)
KT=−174 dBm/Hz
$P_{sav}$=The power available to the active device from the source, where the source is typically the resonator (dBm)
$f_o$=the output frequency of the oscillator, also called the carrier frequency
$Q_L$=the loaded Q of the resonator
$\Delta f$=the offset from the carrier frequency at which the phase noise is measured (Hz)

Leeson's Rule may be used to describe output phase noise spectra for many RF oscillators, whether the RF oscillators are modeled as negative resistance oscillators, loop feedback oscillators, or some other electrical model. The phase noise spectrum of the oscillator denoted by L(f) is determined by providing positive amplitude feedback with 0° phase shift between the output of an amplifier and the input of the amplifier. The positive amplitude feedback is provided at the desired output frequency of the oscillator by passing the signal through a resonator.

The equation in Leeson's Rule can be simplified somewhat. That is, it is assumed there will be no feedback at high offset frequencies that are highly offset from the output frequency (referred to herein also as "high offsets), and the phase noise level will be that of the amplifier along with the noise figure determined by the amplifier input impedance. The phase noise floor of an amplifier with no feedback is well known, and given by:

$$L(f) = 10\ \log_{10}[(FKT/2P_{sav})](\text{dBc/Hz})$$

FIG. 1A illustrates a simplified schematic of a known oscillator with phase noise produced according to Leeson's Rule. In FIG. 1A, the oscillator 100 includes a primary feedback loop 101 with a resistor 111, an inductor 112, and a capacitor 113 in series, a coupler 120, an amplifier 150 and an isolator 119. The direction of travel for signals in the primary feedback loop 101 is counterclockwise. The series Resistor-Inductor-Capacitor (R-L-C) components represent a resonator that has a high impedance off resonance. The resonant frequency is ideally the carrier frequency, but in practice may differ slightly due to characteristics of the other circuit elements in the oscillator. If a resonant frequency for a resonator is the frequency with 0° phase shift and minimum loss for the resonator, the term "off resonance" refers to frequencies with phase shift greater than or less than 0°. An example of such a resonator may be a quartz crystal resonator with its case capacitance nulled out. The gain around the loop is greater than unity with a 0° phase shift at the carrier frequency. The following description is equally valid for a parallel R-L-C resonator in shunt to ground in place of the series resonator, though the parallel R-L-C resonator has a very low impedance off resonance. The coupler 120 transfers some of the power from the oscillator loop to the load 189 as an output power. The isolator 119 is added only to illustrate that Leeson's Rule assumes that the output impedance seen by the amplifier 150 will not impact phase noise of the amplifier 150 in any way, so that phase noise of the amplifier 150 will not be impacted by output impedance.

One disadvantage of previous solutions for low noise oscillator designs to have their output phase noise described by Leeson's Rule is that they do not provide, or even attempt to provide, any negative feedback at high offset frequencies to lower the phase noise floor compared to a standalone amplifier. This may be due to the assumption that output impedance will not impact phase noise of the amplifier 150. This leads to a higher oscillator phase noise floor and higher phase noise at high offset frequencies than if they had found a way to provide negative feedback in these regions. Previous solutions that use feedback for oscillators therefore may improve phase noise close to the resonant frequency, but typically worsen the phase noise floor and phase noise at high offset frequencies.

As a consideration separate from but related to the above, one type of model for an oscillator is a so-called cavity model. A cavity model is an idealized model in which a signal from an oscillator is idealized as travelling between two highly reflective surfaces in a cavity where, at the resonant frequency, the gain for a round trip is greater than 0 dB, and the phase shift is 0°. FIG. 1B illustrates a simplified schematic of a known cavity model in which a signal travels in a cavity mode. In embodiments described later, the two surfaces 199a and 199b of the cavity in the cavity model 199 of FIG. 1B may be represented by resistors with very high resistance values such as 50 Mega-Ohms, or very low impedances, such as 50 milli-Ohms. Effectively, such high resistance or low resistance values may be viewed as reflective surfaces that reflect incident signals with very low loss in a cavity model such as in the known cavity model 199.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
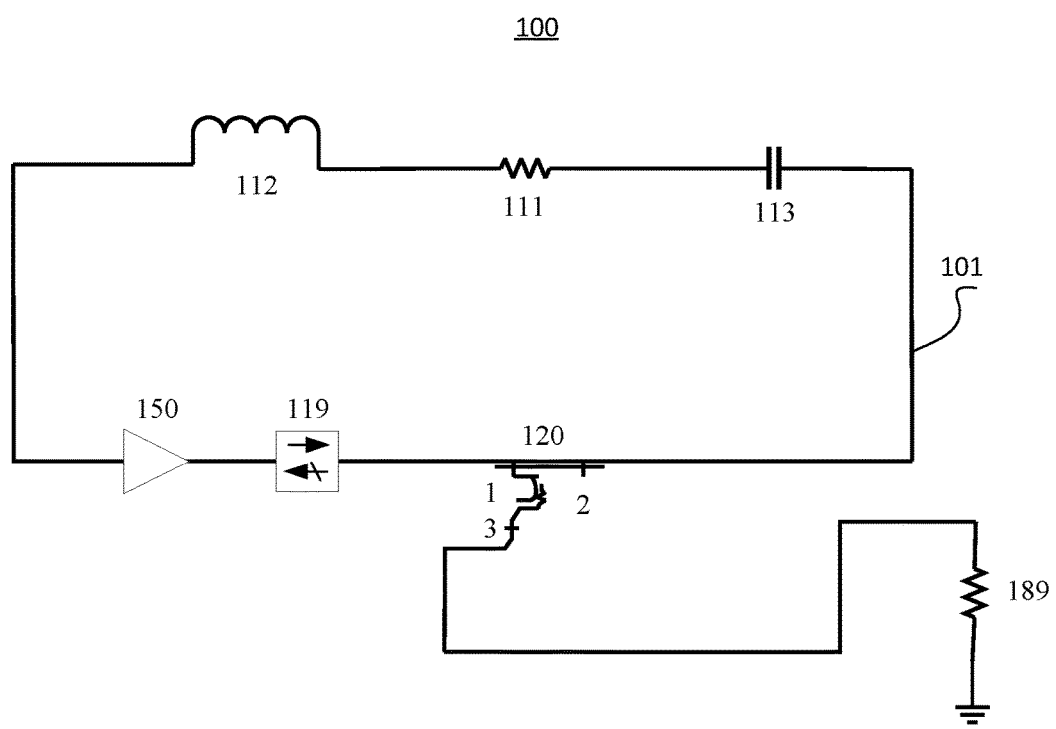
FIG. 1A illustrates a simplified schematic of a known oscillator with phase noise produced according to Leeson's Rule.
Figure 1B:
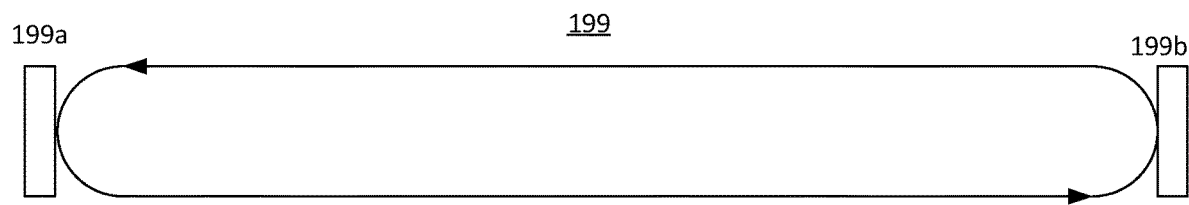
FIG. 1B illustrates a simplified schematic of a known cavity model in which a signal travels in a cavity mode.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only, and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms 'a', 'an' and 'the' are intended to include both singular and plural forms, unless the context clearly dictates otherwise. Additionally, the terms "comprises", and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to", "coupled to", or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

In view of the foregoing, the present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Figure 2A:
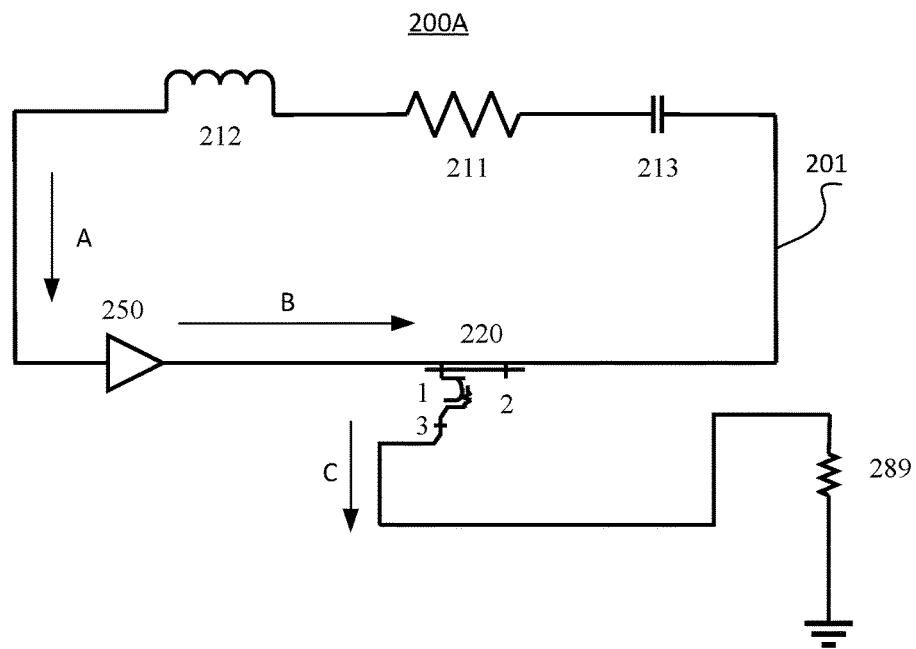
FIG. 2A illustrates an oscillator model near the center of resonance for a low phase noise oscillator using negative feedback, in accordance with a representative embodiment.

As described below, an oscillator circuit is configured to produce negative feedback at high offset frequencies that are highly offset from a center frequency of resonance so that the negative feedback can cancel input signal components at the high offset frequencies of a signal input to an amplifier, effectively reducing phase noise and the phase noise floor at the high offset frequencies. The oscillator circuits can leverage resonators to produce the negative feedback insofar as the resonators have different reflections for incident signals at the center frequency of resonance compared to high offset frequencies. The term "high offset frequencies" as used herein refers to those frequencies at which reflections in the cavity mode will be close to lossless. As an example, for a high-quality quartz resonator used at 100 MHz, frequencies offset from the center of resonance by +/−5 kHz will have reflection losses in the cavity mode less than 0.1 dB, and this may be considered close to lossless. Accordingly, high offset frequencies for a high-quality quartz resonator used in a 100 MHz oscillator could be taken to mean more than +5 kHz or lower than −5 kHz from the center of resonance, or for the general case, approximately $6*(fo/2Q_L)$. In this expression, fo is an output frequency of the oscillator, and $Q_L$ is loaded Q of the resonator and varies based on fo and a distribution of amplitudes of responses to the resonator at different frequencies. For the high-quality quartz resonator used in a 100 MHz oscillator, at offset frequencies more than +/−5 kHz from the center of resonance the reflection losses are close to lossless, and when used to cancel input signal components at the high offset frequencies of a signal input to an amplifier will result in an improvement in phase noise and noise floor due to the negative feedback. The oscillator circuits will have a loss of less than 4.00 dB for a bidirectional trip through the cavity at the high offset frequencies that are offset from the carrier frequency. Additionally, the reflection at the center frequency of resonance is much less than the reflection at high offset frequencies. The stronger reflection for high offset frequencies can be and is leveraged to obtain the higher negative feedback signal at high offset frequencies compared to the center frequency of resonance. The negative feedback signal is used to reduce signal power at the high offset frequencies relative to the center of resonance by cancelling the signal power at the high offset frequencies in the input to the amplifier, and hence improve phase noise at the high offset frequencies. FIG. 2A illustrates an oscillator model near the center of resonance for a low phase noise oscillator using negative feedback, in accordance with a representative embodiment.

In FIG. 2A, the oscillator model 200A includes a primary feedback loop 201 with a resistor 211, an inductor 212, and a capacitor 213 in series, a coupler 220 and an amplifier 250. The direction of travel for signals in the primary feedback loop 201 is counterclockwise. The coupler 220 transfers some of the power from the primary feedback loop 201 to the load 289 as an output power.

By way of explanation, a coupler 220 ideally couples power between some but not all combinations of two of the three labelled points that each correspond to a different port. Accordingly, a coupler 220 is a directional coupler with a directional nature, and this is true of couplers in other embodiments described herein also. For example, the coupler 220 couples power incident on port 1 such that a portion of the incident power exits at port 2 with relatively low loss and 0° phase shift, and such that a smaller portion of the incident power exits at port 3 with relatively higher loss than that which exits at port 2. The path from port 1 to port 2 of the coupler 220 and other couplers may be referred to herein as the main path, whereas the path from port 1 to port 3 of the coupler 220 and other couplers may be referred to herein as the coupled path. The paths from port 2 to port 1 and from port 3 to port 1 may be referred to by the same names or labels as the corresponding paths from port 1 to port 2 and from port 1 to port 3. The coupler 220 is also a reciprocal device such that the coupler 220 couples power incident on port 2 such that it exits at port 1, and incident on port 3 such that it exits at port 1. However, the coupler 220 does not couple power incident on port 3 such that it exits from port 2 or power incident on port 2 such that it exits from port 3. In other words, the coupler 220 will couple a signal incident on port 1 by dividing the signal between ports 2 and 3. On the other hand, signals incident on ports 2 and 3 are essentially passed through entirely to port 1. Actual couplers closely approximate ideal couplers but will have a small amount of leakage too of power incident on port 2 and exiting on port 3 and power incident on port 3 and exiting on port 2. In FIG. 2A, if the coupler 220 couples power from signal B to signal C that is 6.00 dB lower than the original signal B, then the signal D in the primary feedback loop 201 will be approximately 1.6 dB below the level of signal B, and a coupler with this performance will be described as having 6.00 dB coupling, or as a 6.00 dB coupler. The 6.00 dB loss and the 1.6 dB losses are example performances for a carrier signal at 100 MHz. Hereinafter, references to couplers for embodiments described herein may be references to couplers with the characteristics described for the coupler 220.

In FIG. 2A, the amplifier 250 amplifies signals by 10 dB in the primary counterclockwise direction with 0° phase shift. The amplifier 250 amplifies signals by −10 dB in the clockwise direction with 180° phase shift. The coupler 220 couples power from port 1 to port 2 of the primary feedback loop with 0° phase shift. As shown in FIG. 2A, a signal A is input to the amplifier 250, a signal B is output from the amplifier 250, and a signal C is the power coupled out by the coupler 220.

Figure 2B:
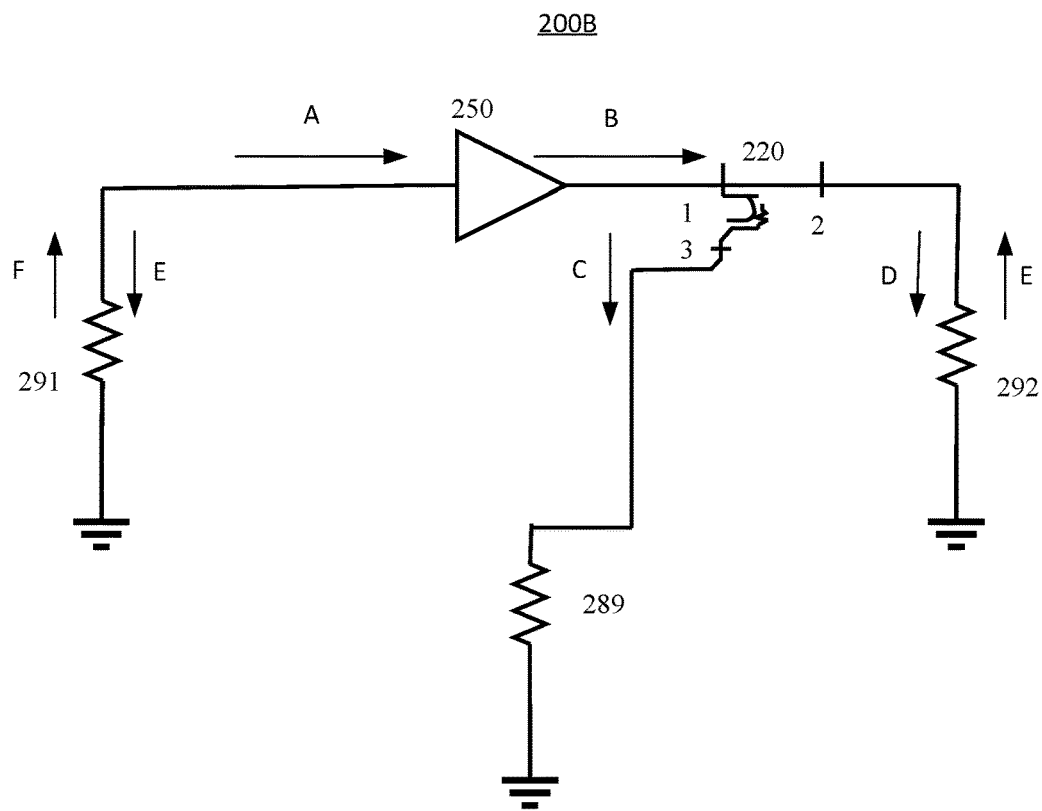
FIG. 2B illustrates an oscillator model at high offset frequencies for a low phase noise oscillator using negative feedback, in accordance with a representative embodiment.

FIG. 2B illustrates an oscillator model at high offset frequencies for a low phase noise oscillator using negative feedback, in accordance with a representative embodiment.

In FIG. 2B, the oscillator model 200B includes a first resistor 291, the amplifier 250, the coupler 220, a second resistor 292 and the load 289. In FIG. 2B, the oscillator model 200B has aspects of a cavity model between the first resistor 291 and the second resistor 292. Generally, when cavity modes are described for either electronic circuits or mechanical systems, end terminations are described as short circuits or open circuits. An end termination that is an open circuit will produce a reflection with 0° phase shift, and the same magnitude as the incident wave. An end termination that is a short circuit will produce a reflection with 180° phase shift, and the same magnitude as the incident wave. The cavity terminations of open circuits described herein are those described for resistors with large impedances such as 50 Mega-Ohms, since 50 Mega-Ohms is large enough to stand for an open circuit. An example of an electronic cavity with open circuit terminations is a semiconductor cavity mode laser. The cavity terminations of short circuits described herein are those described for resistors with small impedances, such as 50 milli-Ohms, since 50 milli-Ohms is small enough to stand for a short circuit. An example of an electronic cavity with short circuit terminations is a waveguide resonator in the TE10 mode, which has short circuited ends closing the cavity at both ends in the direction of the propagating wave, and its reflection. Since the terminations on the cavity are essentially infinite or zero impedances for the modelling described herein, the terminations will have no loss.

Additionally, in models described herein with couplers, the couplers are considered lossless in terms of dissipation, so there are no losses beyond what occurs from coupling a portion of the signal away from one of the ports. As a result, losses in models may be limited to those due to an attenuator. Since a wave in the cavity mode will pass through the attenuator twice for a round trip, the amount of loss in the cavity is simply twice the value of the attenuator. Additionally, the phases for a cavity model will be unchanged in a round trip through the cavity, since for open circuits the reflection produces a 0° phase shift and for short circuits the reflection produces a 180° phase shift which after two reflections is the equivalent of a 0° phase shift. The 0° phase shift in a round trip will therefore translate to a series RLC resonator or a shunt RLC resonator, and attenuation of 2.00 dB in the oscillator circuit will result in a 4.00 dB round trip loss or a −4.00 dB of gain. To be sure, when an oscillator circuit consistent with the oscillator model 200B is started, the largest signal at high offset frequencies will be for the first cycle of the oscillator circuit. Afterwards the feedback effects at high offset frequencies described herein will result in lower signals at high offset frequencies for each cycle after the first cycle. The signals may become continually lower for each cycle until an equilibrium is reached in the oscillator circuit.

In FIG. 2B, the amplifier 250 amplifies signals by 10 dB in the forward direction with 0° phase shift. The amplifier 250 amplifies signals by −10 dB in the reverse direction with 180° phase shift. The coupler 220 couples power incident on port 1 to exit on port 2 of the primary feedback loop with 0° phase shift. As shown, the signal A is input to the amplifier 250, the signal B is output from the amplifier 250, and the signal C is the power coupled out by the coupler 220. Signal D is the power from signal B that is not coupled out by the coupler 220 and remains on the thru path to exit at port 2. Signal D is reflected by the second resistor 292 as signal E, and signal E then travels through the coupler 220 and the amplifier 250 in the reverse direction. Signal E is then reflected from the first resistor 291 as signal F. In the oscillator model of FIG. 2B, the first resistor 291 and the second resistor 292 have high resistances such as 50 Mega-Ohms, and act as reflective surfaces of a cavity in a cavity.

As described herein, in the oscillator model 200B negative feedback is produced at high offset frequencies that are highly offset from the center frequency of resonance so that the negative feedback is used to cancel input signal components at the high offset frequencies of the signal input to the amplifier 250, effectively reducing phase noise and the phase noise floor at the high offset frequencies. For reasons described above, gains for the low phase noise oscillator with negative feedback can be expressed in term of where a −4.00 dB gain or a 4.00 dB loss occurs for a round trip of the signal in the cavity mode. At high offset frequencies the gains are tied to the reflections described for the cavity mode in terms of short circuit or open circuit terminations for the cavity. In frequency terms, the high offset frequencies for a high-quality quartz resonator used in a 100 MHz oscillator may be considered those frequencies offset from the carrier frequency by more than +/−5 kHz, or for the general case approximately $6*(fo/2Q_L)$. The distribution of amplitudes includes a maximum amplitude at a center frequency and lower amplitudes at frequencies lower than and higher than the center frequency. Additionally, the above noted −4.00 dB gain or 4.00 dB loss may be described in terms of the expression $Q_L=fo/(\Delta f(P-3\ dB))$. For this expression, P is the maximum amplitude at the center frequency, P−3 dB is 3.00 dB lower than P at two frequencies offset from the center frequency, and $\Delta f$ is an absolute difference in frequency between the two frequencies offset from the center frequency.

Insofar as the feedback signal in the cavity mode must be reasonably substantial to produce the desired reduction in amplitude, the gain at the high offset frequencies is expressed in terms of a round trip of the signal in the cavity, and should be −4.00 dB or higher, corresponding to −2.00 dB or higher gain for the attenuator in the cavity mode. Put differently, for offsets greater than $6fo/2Q_L$, if a round trip of the cavity mode has less than 4.00 dB of loss, there will be a sufficient signal to use for negative feedback to get significant phase noise improvements at offsets as close as $fo/2Q_L$. If loss is less than 4.00 dB in a round trip through the cavity mode at offsets greater than $6fo/2Q_L$, this indicates that the reflection(s) off resonance can be used to obtain significant phase noise improvement at offsets as close as $fo/2Q_L$. At offsets above $6fo/2Q_L$, the reflection(s) can be assumed to be essentially lossless.

Figure 5A:
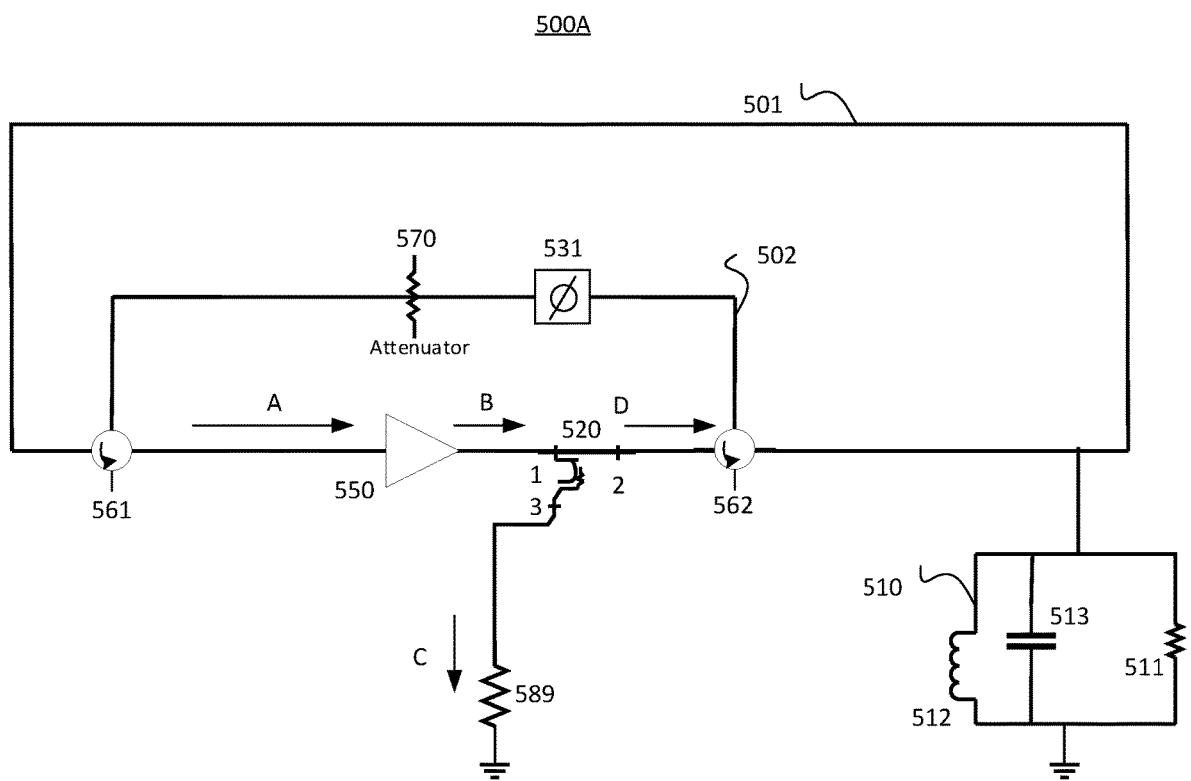
FIG. 5A illustrates an oscillator circuit implementation for a low phase noise oscillator using negative feedback, in accordance with a representative embodiment.
Figure 6A:
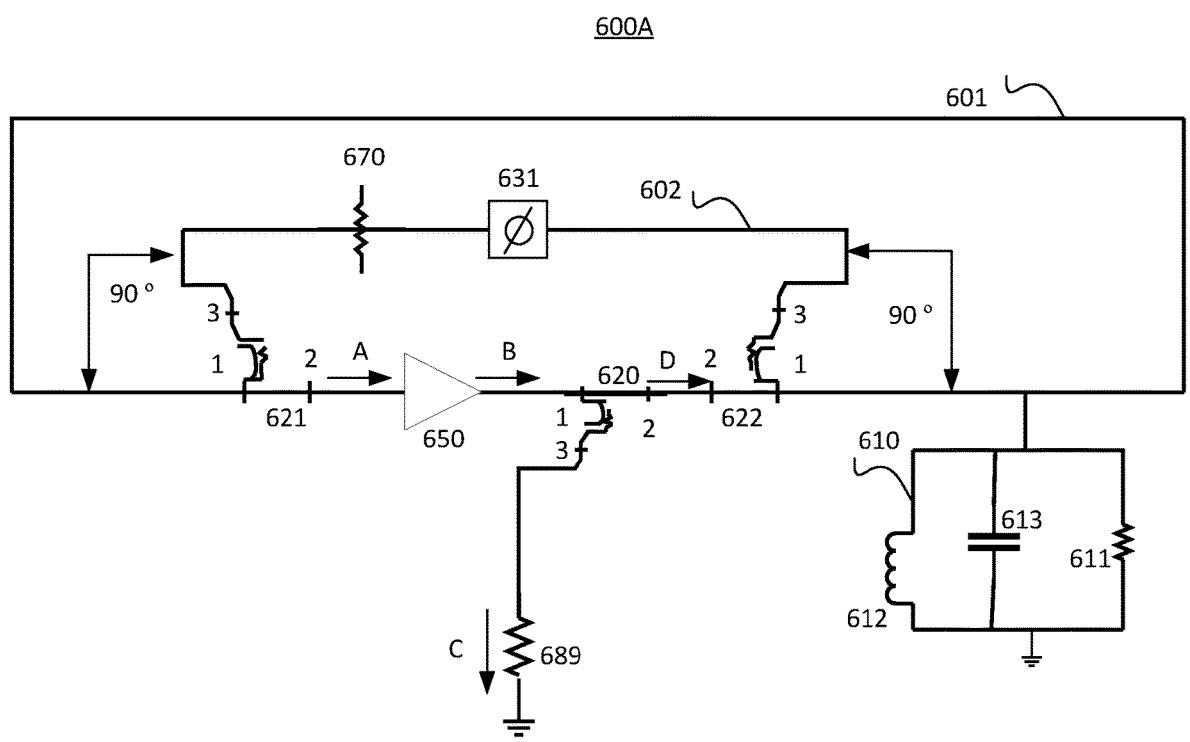
FIG. 6A illustrates an oscillator circuit implementation for a low phase noise oscillator using negative feedback, in accordance with a representative embodiment.
Figure 6B:
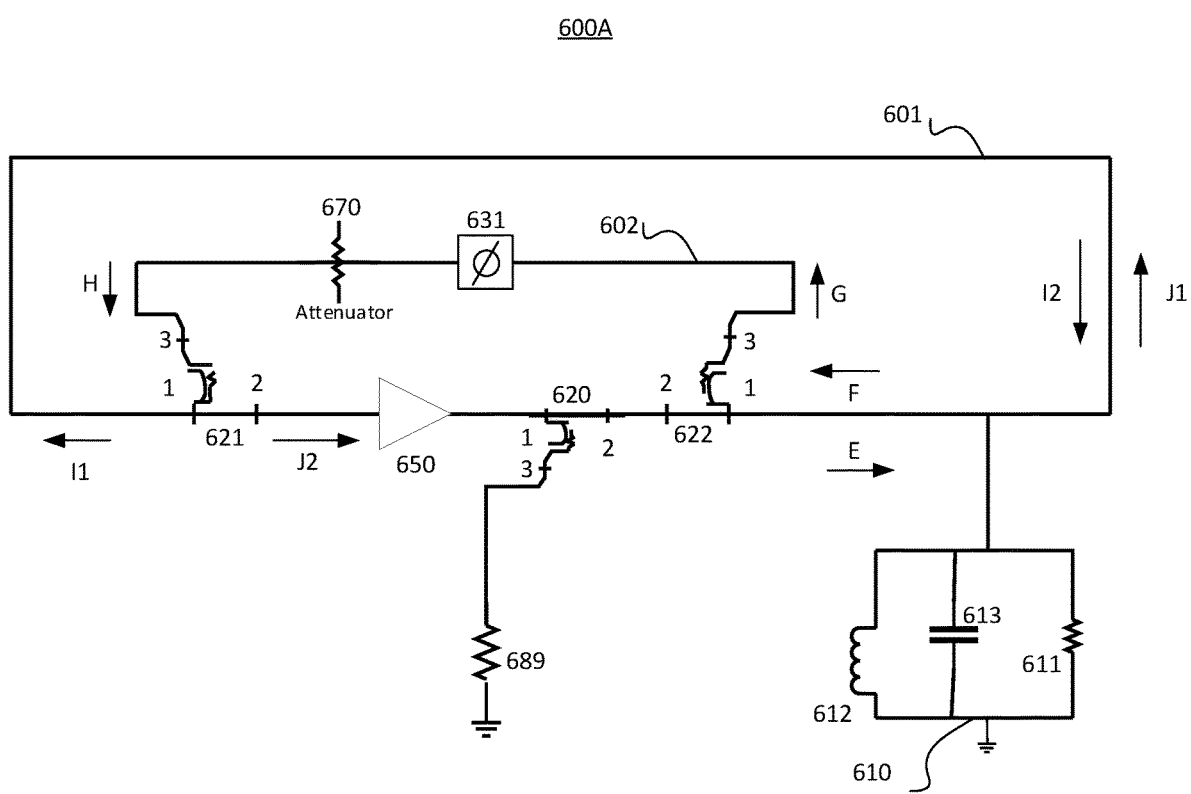
FIG. 6B illustrates another view of the oscillator circuit implementation for a low phase noise oscillator using negative feedback in FIG. 6A, in accordance with a representative embodiment.

For embodiments described later, the loss of less than 4.00 dB for a bidirectional trip through an equivalent cavity at high offset frequencies corresponds to two reflections off of the resonator that provides the input signal to an oscillator. The reflections occur in the signal path for feedback to an amplifier. Each reflection results in a loss of less than 2.00 dB for the high offset frequency components, and in the representative embodiments described later two such reflections still leaves a substantial negative feedback signal to the amplifier, which in turn allows the amplifier to offset the input signal to the amplifier at the high offset frequencies so that the phase noise floor is lowered at the high offset frequencies. The loss of less than 2.00 dB is observable in simulations and/or testing of actual circuits, and actual losses for the feedback signal may be even less in some embodiments. In the embodiment of FIGS. 5A/5B described later, the equivalent reflections are shown by signal E and signal F and by signal I2 and signal J in FIG. 5A, leading to the feedback of signal K to the amplifier 550. In the embodiment of FIGS. 6A/6B/6C, the equivalent reflections are shown by signal E and signal F and by signal I2 and signal J1 in FIG. 6B, leading to the feedback of signal J2 to the amplifier 650. The feedback of signal K in FIG. 5A and of signal J2 in FIG. 6B is the negative feedback signal used by the amplifier 550 and by the amplifier 650, respectively, to offset the input signal at these amplifiers at the high offset frequencies, which results in the lowered phase noise floor at these frequencies in the output signal from these amplifiers.

Figure 3:
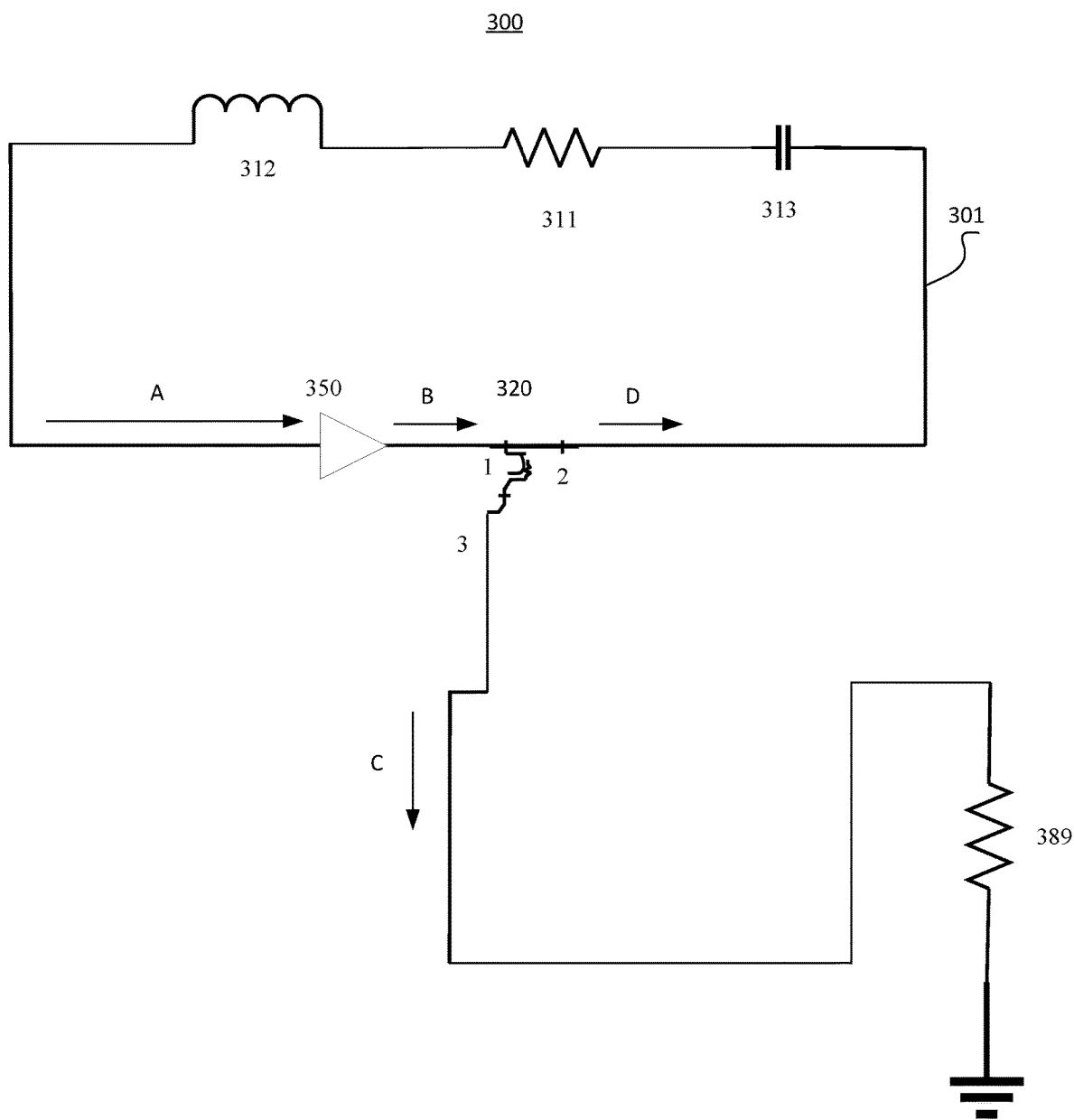
FIG. 3 illustrates a simplified oscillator circuit for a low phase noise oscillator using negative feedback, in accordance with a representative embodiment.

FIG. 3 illustrates a simplified oscillator circuit for a low phase noise oscillator using negative feedback, in accordance with a representative embodiment.

In FIG. 3, the simplified oscillator circuit 300 includes a primary feedback loop 301 with a resistor 311, an inductor 312, and a capacitor 313 in series, a coupler 320 and an amplifier 350. The direction of travel for signals in the primary feedback loop 301 is counterclockwise. The coupler 320 transfers some of the power from the primary feedback loop 301 to the load 389 as an output power.

In FIG. 3, the amplifier 350 amplifies signals by 10 dB in the primary counterclockwise direction with 0° phase shift. The amplifier 350 amplifies signals by −10 dB in the clockwise direction with 180° phase shift. The coupler 320 couples power out of the primary feedback loop. As shown in FIG. 3, a signal A is input to the amplifier 350, a signal B is output from the amplifier 350, a signal C is the power coupled out by the coupler 320, and a signal D remains in the primary feedback loop 301 after the power of signal C is coupled out. The transition from signal B to signal D in the coupler 320 is into port 1 and out of port 2, with 0° phase shift. In the simplified oscillator circuit 300, negative feedback is produced at high offset frequencies that are highly offset from the center frequency of resonance so that the negative feedback is used to cancel input signal components at the high offset frequencies of the signal input to the amplifier 350, effectively reducing phase noise and the phase noise floor at the high offset frequencies.

Figure 4A:
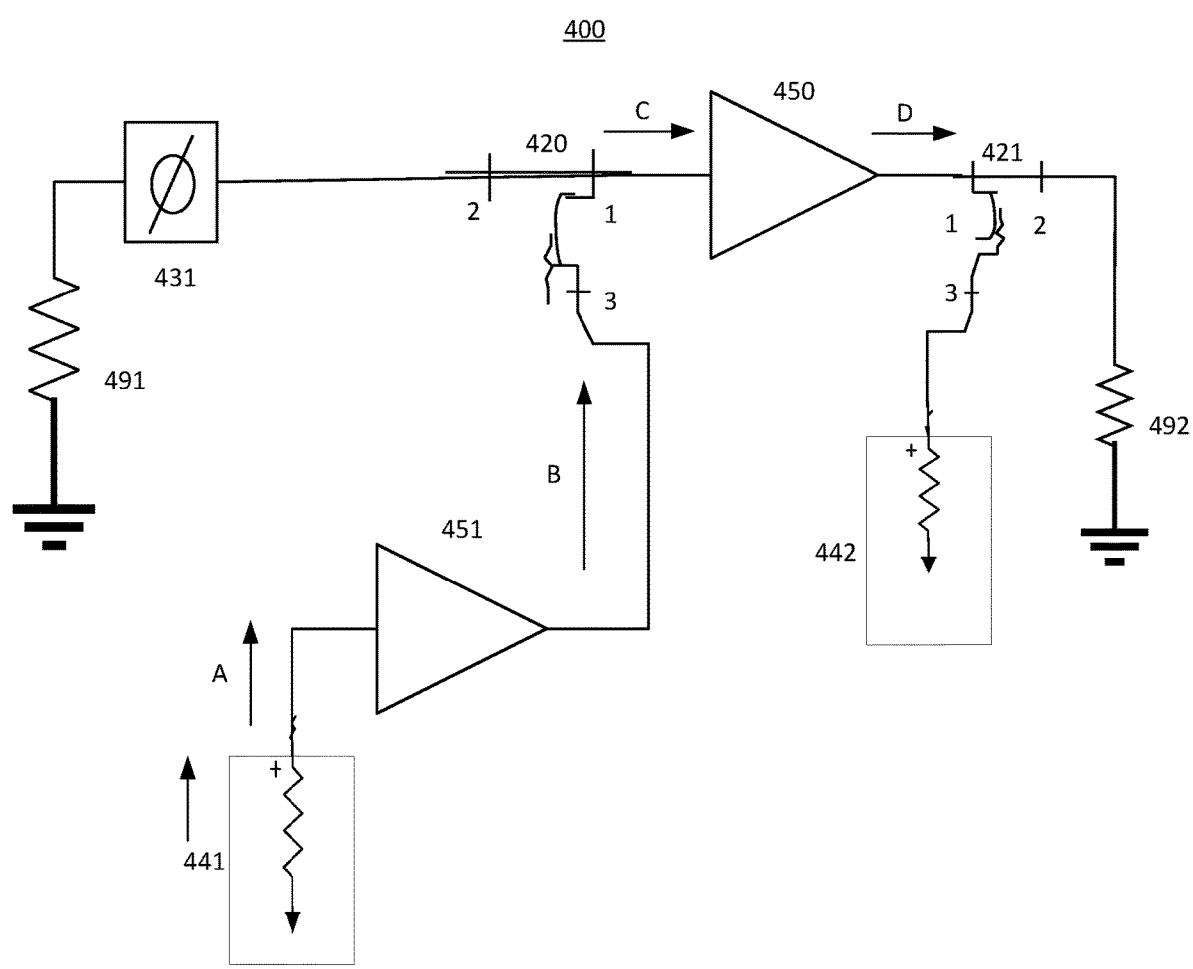
FIG. 4A illustrates another simplified oscillator circuit for a low phase noise oscillator using negative feedback at high offset frequencies where the cavity model is valid, in accordance with a representative embodiment.

FIG. 4A illustrates another simplified oscillator circuit for a low phase noise oscillator using negative feedback at high offset frequencies where the cavity model is valid, in accordance with a representative embodiment.

In FIG. 4A, the simplified oscillator circuit 400 includes a first coupler 420, a second coupler 421, a phase shifter 431, a first test port 441 and a second test port 442, a first amplifier 450, a second amplifier 451, a first resistor 491, and a second resistor 492.

In the simplified oscillator circuit 400 of FIG. 4A, the first resistor 491 and the second resistor 492 have high resistances such as 50 Mega-Ohms, and act as reflective surfaces of a cavity in a cavity model. The phase shifter 431 produces a 90° phase shift and has an impedance of 50 Ohms. The first coupler 420 has a coupling value of 60 dB, a loss of 0 dB, a directivity of 140 dB, and an impedance of 50 Ohms. The second coupler 421 has a coupling value of 60 dB, a loss of 0 dB, a directivity of 140 dB, and an impedance of 50 Ohms. The first amplifier 450 has a forward gain of 10 dB and a negative phase shift of 90°, and reverse gain of −10 dB and a negative phase shift of 270°. The second amplifier 451 has a forward gain of 120 dB and 0° phase shift. The gain of the second amplifier 451 and the coupling values of the first coupler 420 and the second coupler 421 are much higher than would be used in an actual circuit and are used to better show performance in the model for the ideal case. The first test port 441 has an impedance of 50 Ohms, and the second test port 442 has an impedance of 50 Ohms.

For the oscillator circuits described herein, cavity feedback reduces the magnitude of the output signal in the cavity mode even at the center of resonance when compared to a Leeson's Rule class oscillator. The oscillator circuits described herein reduces the magnitude of the power coupled out, for example by the first coupler 420 in FIG. 4A, much more at high offset frequencies than at the center frequency of resonance. This is an important aspect of how the high offset phase noise and phase noise floor are improved. Indeed, the round trip gain of a signal for a single cycle in the cavity mode before feedback can occur is lowest at the center frequency of resonance and increases at high offset frequencies as the resonator acts more like a perfect open circuit for a series RLC resonator, or a perfect short circuit for an ideal parallel RLC resonator. Thus, at high offset frequencies, with a larger signal to work with, this higher level signal may be used to provide higher negative feedback relative to at the center of resonance, and hence preferentially reduce the signal at high offset frequencies. Since the gain of the signal in the cavity mode is only asymptotically approaching some final value, the gain of −4.00 dB or more for the single cycle of a round trip of the cavity mode at high offset frequencies is a relatively easy marker of the benefits of the low phase noise oscillator using negative feedback described herein. In other words, a −4.00 dB gain or less for a single cycle round trip is an aspect of the frequency response that is obtained at high offset frequencies, but not the only aspect or even the most important aspect of the improvement described herein.

Figure 4B:
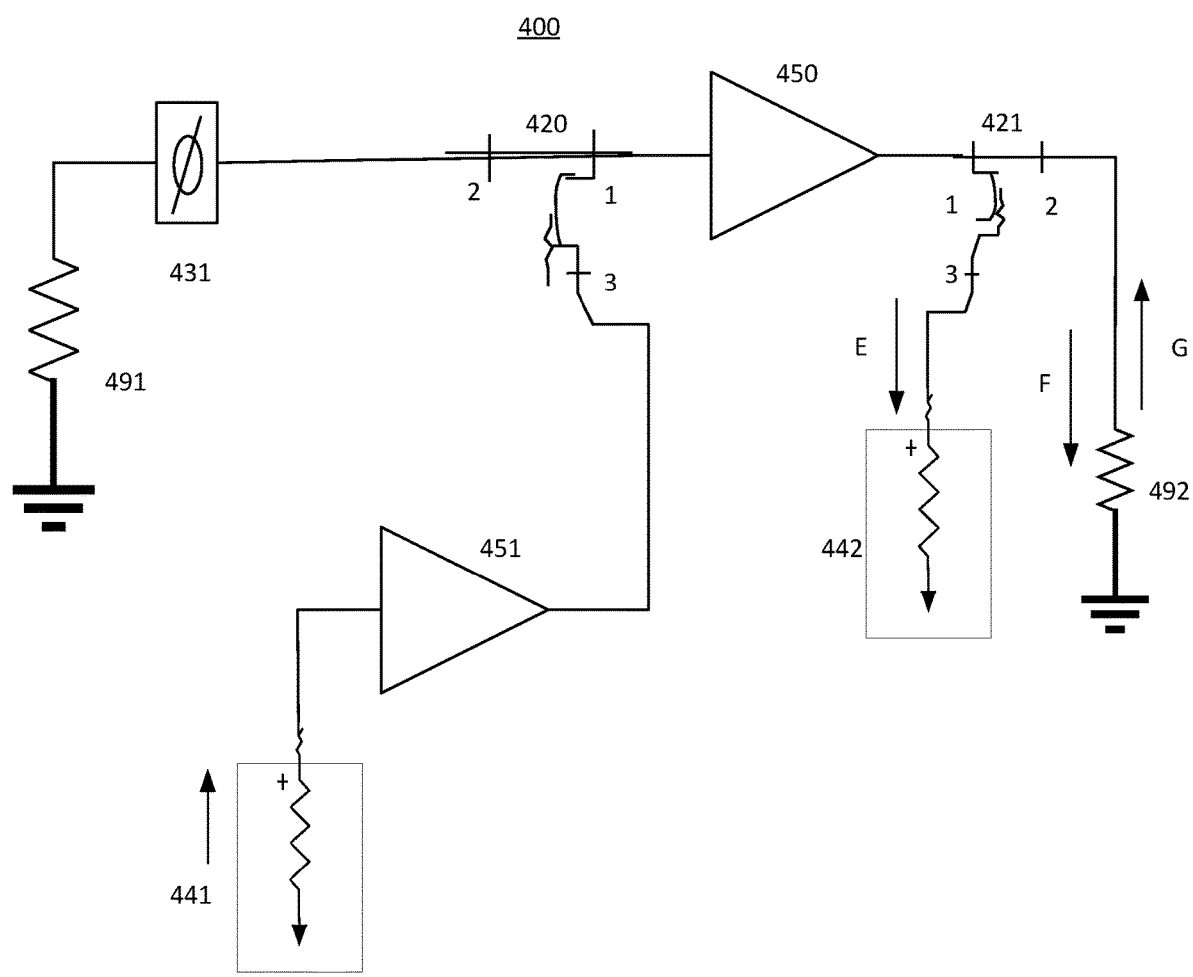
FIG. 4B illustrates another view of the simplified oscillator circuit for a low phase noise oscillator using negative feedback in FIG. 4A, in accordance with a representative embodiment.
Figure 4C:
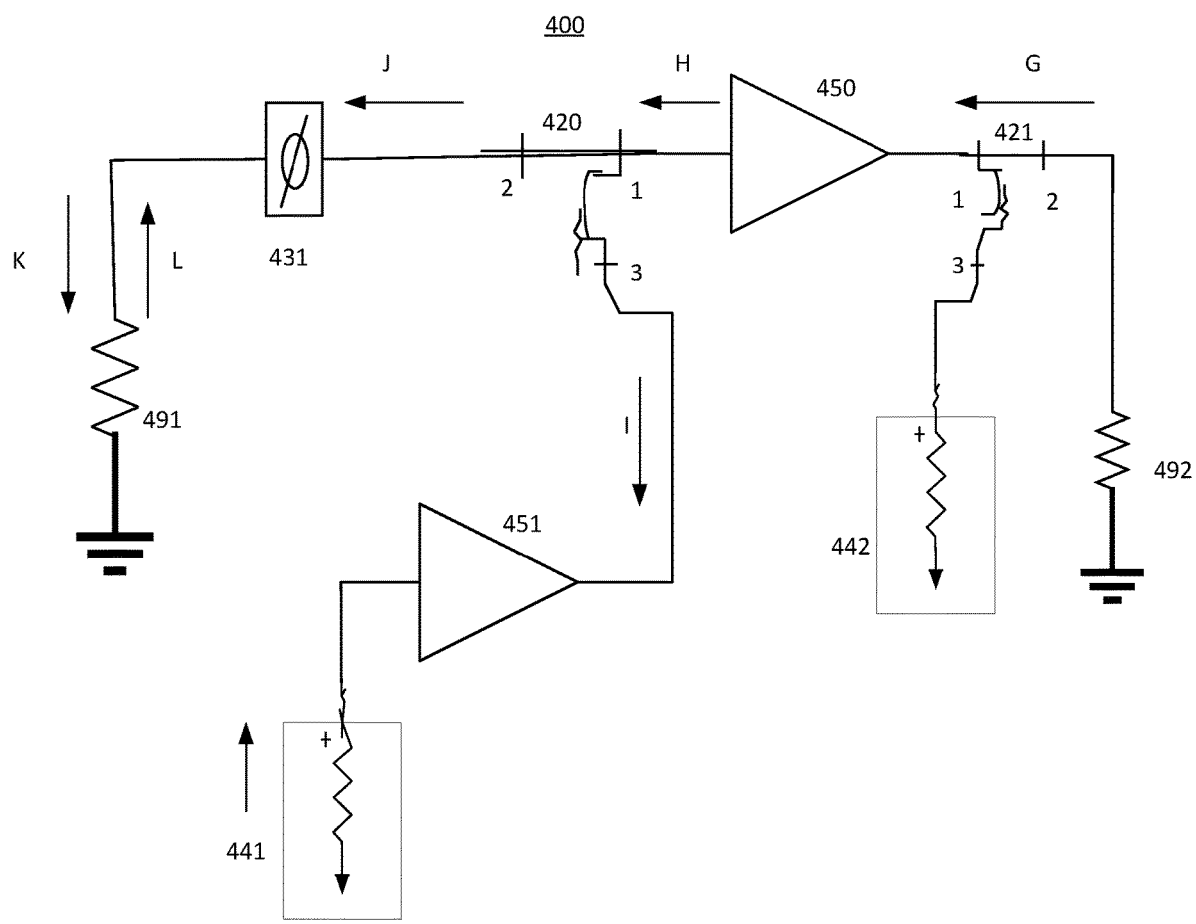
FIG. 4C illustrates another view of the simplified oscillator circuit for a low phase noise oscillator using negative feedback in FIGS. 4A and 4B, in accordance with a representative embodiment.

FIGS. 4B and 4C illustrate additional views of the same simplified oscillator circuit for a low phase noise oscillator using negative feedback as in FIG. 4A, in accordance with a representative embodiment. Taken together, FIGS. 4A, 4B and 4C illustrate a signal flow from the first test port 441. In FIG. 4A, the signal flow starts with signal A which is input through the first test port 441. Signal A passes through the second amplifier 451 and is output from the second amplifier 451 as signal B. Signal B passes through the first coupler 420, and signal C emerges from the first coupler 420. Signal C passes through the first amplifier 450, and signal D emerges from the first amplifier 450 towards the second coupler 421.

As shown then in FIG. 4B, signal E emerges from the second coupler 421 towards the second test port 442. Signal F also emerges from the second coupler 421 but towards the second resistor 492. Signal F is reflected from the second resistor 492 as signal G. As shown then in FIG. 4C, signal G passes through the second coupler 421 and the first amplifier 450, and signal H emerges from the first amplifier 450. Signal H passes through the first coupler 420. Signal I is resultingly emitted from the first coupler 420 towards the first test port 441 where it is dissipated, and signal J emerges from the first coupler 420 towards the phase shifter 431. Signal K emerges from the phase shifter 431 and is reflected from the first resistor 491 as signal L. Signal L will then pass through the phase shifter 431. Additional components of the original signal A (e.g., signal M (not shown), signal N (not shown)) will emerge from the phase shifter 431, pass through the first coupler 420 and provide negative feedback to the original signal input to the first amplifier 450, which was signal C in FIG. 4A.

In FIGS. 4A, 4B and 4C, the first resistor 491 and the second resistor 492 strongly reflect incident signals at high offset frequencies. There is a relatively low loss between the output of the first amplifier 450 and the second resistor 492 due to the high 60 dB coupling between port 1 and port 3 of the second coupler 421 leading to a low insertion loss in the through path between port 1 and port 2 of the second coupler 421. The first resistor 491 and the second resistor 492, along with the phase shifter 431, are used to provide negative feedback to the first amplifier 450. Accordingly, FIGS. 4A, 4B and 4C partly illustrate a modelized cavity view for the high offset signal components.

Although not belabored herein, the low phase noise oscillator using negative feedback effectively lowers amplitude level of the phase noise floor. In the simplified oscillator circuit 400, negative feedback is produced at high offset frequencies that are highly offset from the center frequency of resonance so that the negative feedback is used to cancel input signal components at the high offset frequencies of the signal input to the first amplifier 450, effectively reducing phase noise and the phase noise floor at the high offset frequencies. Noise floor decreases in terms of power (dBm/Hz) as oscillator performance improves, and in terms of noise power relative to the carrier (dBc/Hz). However, if described in terms of dynamic range the signal to noise ratio becomes larger in dB. So, a signal with a carrier power of +10 dBm and a noise floor of −160 dBm/Hz has noise floor power relative to the carrier of −170 dBc/Hz, and a signal to noise ratio of 170 dB if measured in a 1 Hz bandwidth. If oscillator performance is improved by lowering the phase noise floor an additional 10 dB, so that now the phase noise floor is −170 dBm/Hz, the noise power relative to the carrier is −180 dBc/Hz, and the signal power relative to the noise (measured in a 1 Hz bandwidth) is 180 dB. An example of how the phase noise floor is lowered is shown in a plot in FIG. 7A below, but these plots will vary depending on the particulars of the oscillator circuit implementations consistent with the descriptions herein.

FIG. 5A illustrates an oscillator circuit implementation for a low phase noise oscillator using negative feedback, in accordance with a representative embodiment.

In FIG. 5A, the oscillator circuit 500A includes a resonator 510, a primary loop 501 and a second loop 502. The resonator 510 includes a resistor 511, an inductor 512, and a capacitor 513. The resistor 511, the inductor 512 and the capacitor 513 are provided in parallel in the resonator 510. The primary loop 501 is a first loop circuit and includes a first circulator 561, a second circulator 562, a first coupler 520, a resonator 510, and a first amplifier 550. The primary loop 500A may shift phase between −30° and +30° for a round trip of the primary loop 500A.

A second loop is a feedback loop in embodiments herein and includes at least one circuit component. Specifically, in the embodiment of FIG. 5A, the second loop 502 also includes the first circulator 561, the second circulator 562, the first coupler 520, and the first amplifier 550, as well as the attenuator 570 and the phase shifter 531. The sum of the phase shift through the attenuator 570 and the phase shifter 531 may be, for example, 180°. The first coupler 520 transfers some of the power output from the first amplifier 550 to the load 589 as an output power.

The resonator 510 is physically in the primary loop 501 but functionally part of both the primary loop 501 and the second loop 502 in that the resonator 510 is a key to making feedback in the second loop 502 work correctly. The resonator 510 has a much higher reflection for signals at frequencies highly offset from the center of resonance (carrier frequency), compared for example to signals at the center of resonance. With appropriate circuitry as in the oscillator circuit 500A, a much higher amount of negative feedback can be provided at these frequencies highly offsets from the center of resonance. This reduces magnitude of the highly offset signal components relative to the carrier frequency signal components, which improves the phase noise. That is, in the oscillator circuit 500A, negative feedback is produced at high offset frequencies that are highly offset from the center frequency of resonance so that the negative feedback is used to cancel input signal components at the high offset frequencies of the signal input to the first amplifier 550, effectively reducing phase noise and the phase noise floor at the high offset frequencies.

In other words, the primary loop 501 and the second loop 502 overlap, and even though the phase shifter 531 and the attenuator 570 are not in the first loop they contribute to the characteristics of the feedback to the first amplifier 550. Similarly, reflections from the resonator 510 contribute to the characteristics of the second loop 502, so that the resonator 510 is still functionally part of the second loop 502. The added components in the second loop 502 therefor work with components in the primary loop 501 including the resonator 510. The resonator 510 strongly reflects incident signal components at high offset frequencies and reflected signals output from the first amplifier 550 are reflected from the resonator 510 and circulated by the second circulator 562 into the second loop 502.

By way of explanations, the first circulator 561 and the second circulator 562 change the direction of signal flow in counterclockwise directions in FIG. 5A. Each of the first circulator 561 and the second circulator 562 may have three ports, so that a signal entering either of the first circulator 561 or the second circulator 562 in one port will exit the first circulator 561 or the second circulator 562 via the next port in the counterclockwise direction. As an example, a signal entering the first circulator 561 from the left will exit from the right towards the first amplifier 550, whereas a signal entering the first circulator 561 from the right will exit from the top towards the attenuator 570.

As an example, the resistor 511 has a resistive value of 25 Ohms, the capacitor 513 has a capacitance of 8 μF (microFarads), and the inductor 512 has an inductance of 0.316629 pH (Pico-henrys). The first circulator 561 has a loss in one turn of 0.5 dB, and the second circulator 562 has a loss in one turn of 0.5 dB. The first amplifier 550 has a primary gain of 12.00 dB and a 0° phase shift in the forward direction (S21), a gain of magnitude zero and a 0° phase shift for its input reflection coefficient (S11), a gain of magnitude zero and a phase shift of 180° for its output reflection coefficient (S22), and a gain of magnitude zero and a 0° phase shift for its reverse transmission coefficient (S12). The first coupler 520 couples power from port 1 of the first coupler 520 to port 2 of the first coupler 520 with a loss of 1.6 dB, and port 1 of the first coupler 520 to port 3 of the first coupler 520 with a loss of 6.00 dB, and from there the signal proceeds to load 589. The first coupler 520 has an impedance of 50 Ohms. The second circulator 562 couples power going counter-clockwise from the output of port 2 of the second circulator 562 to the input of the resonator 510. The reflection of the resonator 510 proceeds back toward the second circulator 562 and is routed toward the phase shifter 531. The phase shifter 531 produces a phase shift of 90° and has an impedance of 50 Ohms. The first circulator 561 couples power going counterclockwise from the second loop 502 back to the primary loop 501 where it circulates clockwise until it hits the resonator 510. The signal reflects off the resonator 510 and circulates counterclockwise in the primary loop 501 back to the first circulator 561. The signal proceeds counterclockwise in the first circulator 561 and is routed to the input of the first amplifier 550 where is provides negative feedback.

The attenuator 570 may have an attenuation that is time dependent. For example, the attenuator 570 may allow the negative feedback to be increased gradually so as to allow the second loop 502 with the first circulator 561 and the second circulator 562 to allow the use of high feedback without causing oscillations. This can improve stability of negative feedback by gradually decreasing the attenuation from an initially large amount. An example of the attenuator 570 is a coupler as described herein, but attenuators described herein are not limited to couplers. For example, attenuators consistent with the teachings herein may be resistive attenuators. A circuit such as the oscillator circuit 500A with the first circulator 561 and the second circulator 562 greatly improves phase noise insofar as the circulator circuits provide the most negative feedback. However, on the first cycle of the feedback, the feedback signal coming back to the input of the first amplifier 550 may be relatively large since there is no feedback for the first cycle, and this may create a ringing in the oscillator circuit 500A. Any such ringing can be avoided with a time dependent attenuation, so that initially the attenuator 570 is set to a high enough level that the oscillator circuit 500A is stable with feedback, and the output power for the noise is reduced somewhat. By reducing the noise output power, a higher level of feedback can be allowed without being unstable, and this leads to a lower output power for the noise again. As this process continues, eventually the attenuation can be set to 0 dB for maximum feedback, and maximum noise reduction. This can be implemented in a straightforward manner with a PIN diode attenuator, which allows for continuously variable attenuation without adding noise. Therefore, the attenuator 570 in FIG. 5 may have an attenuation that varies over time. An attenuator 570 that varies attenuation as a function of time when provided may serve to stabilize the second loop 502.

Figure 5B:
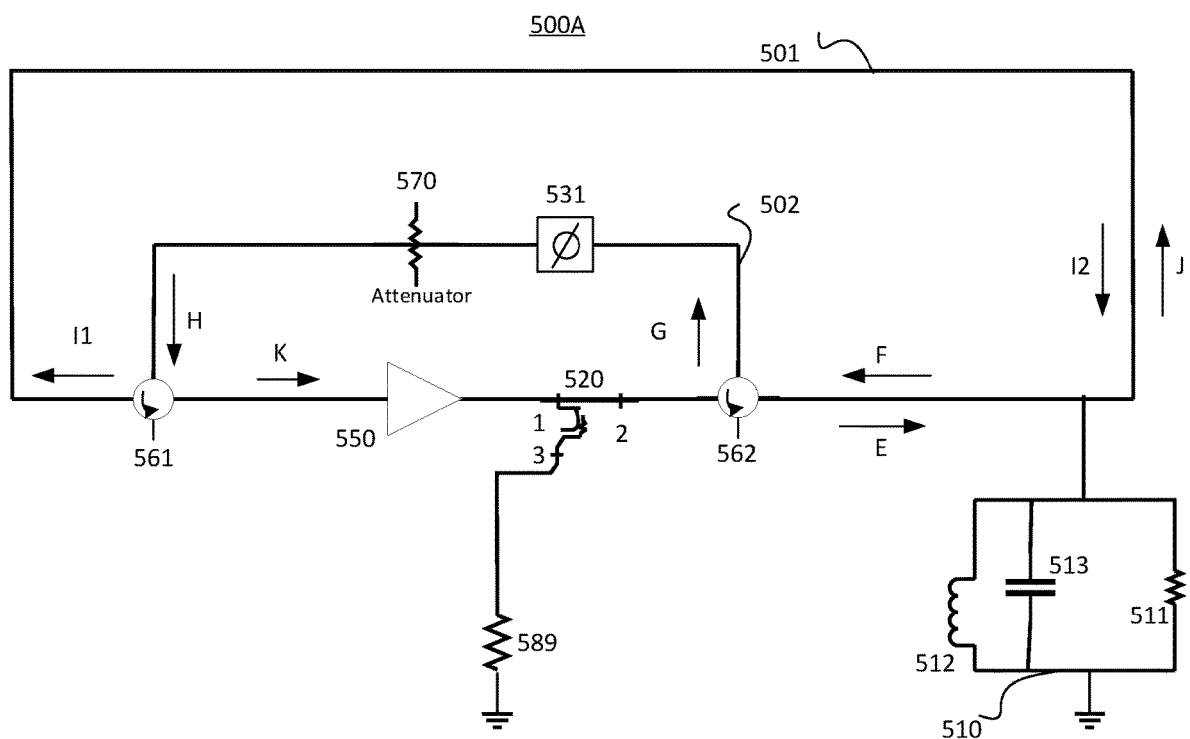
FIG. 5B illustrates another view of the oscillator circuit implementation for a low phase noise oscillator using negative feedback in FIG. 5A, in accordance with a representative embodiment.

FIG. 5B includes the same oscillator circuit 500A as in FIG. 5A. Taken together, FIGS. 5A and 5B illustrate a signal flow that begins with the input to the first amplifier 550. The input to the first amplifier 550 is the first signal A, and the output from the amplifier is the second signal B. The power coupled from the primary loop 501 by the first coupler 520 is the third signal C, and the power that is passed through the first coupler 520 in the primary loop 501 and the second loop 502 is the fourth signal D. Signal D then enters the second circulator 562 and this power is routed towards the resonator 510 as signal E. At high offset frequencies, the signal E will be strongly reflected from the resonator 510 as signal F which proceeds back to the second circulator 562 and is routed to the second loop 502 where it becomes signal G. Signal G proceeds towards the phase shifter 531 and exits the phase shifter 531 and attenuator 570 as signal H, signal H enters the first circulator 561 and is turned back towards the resonator 510 as signal I1. Signal I1 enters the primary loop 501 in a clockwise flow where it proceeds to the resonator 510 as signal I2, and at high offset frequencies is strongly reflected by the resonator 510 as signal J. Signal J returns to the first circulator 561 and emerges as signal K as input of the first amplifier 550 providing feedback to the first amplifier 550.

Additionally, not every change in the signals resulting from the first signal A is shown in FIGS. 5A and 5B. For example, even the eleventh input as signal K to the first amplifier 550 will result in additional output, which in turn will result in two more signals output from the first coupler 520. Thus, an input A to an amplifier such as the first amplifier 550 may result in numerous other signal components not specified in the FIGs. herein. That is, the signal flow illustrated in FIGS. 5A and 5B shows only the first cycle of the signals with different characteristics that are present in the oscillator circuit 500A. For example, the first signal A and the eleventh signal k are both inputs to the first amplifier 550, and this reflects one aspect of the feedback characteristics of the oscillator circuit 500A insofar as the eleventh signal k results from the first signal A. Additionally, signals may change each time they pass through or are reflected by any of the elements in the primary loop 501 or the second loop 502. For example, signals at frequencies at high offset frequencies that are highly offset from a carrier signal may be reflected by the resonator 510, and such signals may lose some power due to the reflection.

In the embodiment of FIGS. 5A and 5B, the output of the first amplifier 550 is fed back to the first amplifier 550 through a combination of reflections off the resonator 510 in the primary loop 501. For example, signal E reflects off the resonator 510 at one point as signal F and signal I2 reflects off of the resonator 510 at another point as signal J. The reflection of high offset components of the output from the first amplifier 550 are possible due to the second loop 502 insofar as the second circulator 562 is present in FIG. 5B in order, for example, to feed signal G into the second loop 502 as feedback for the first amplifier 550. Accordingly, the feedback is due to the second loop 502 in the embodiment of FIGS. 5A and 5B, but in this embodiment and others the feedback may be due to a combination of reflections off a resonator such as the resonator 510.

Figure 5C:
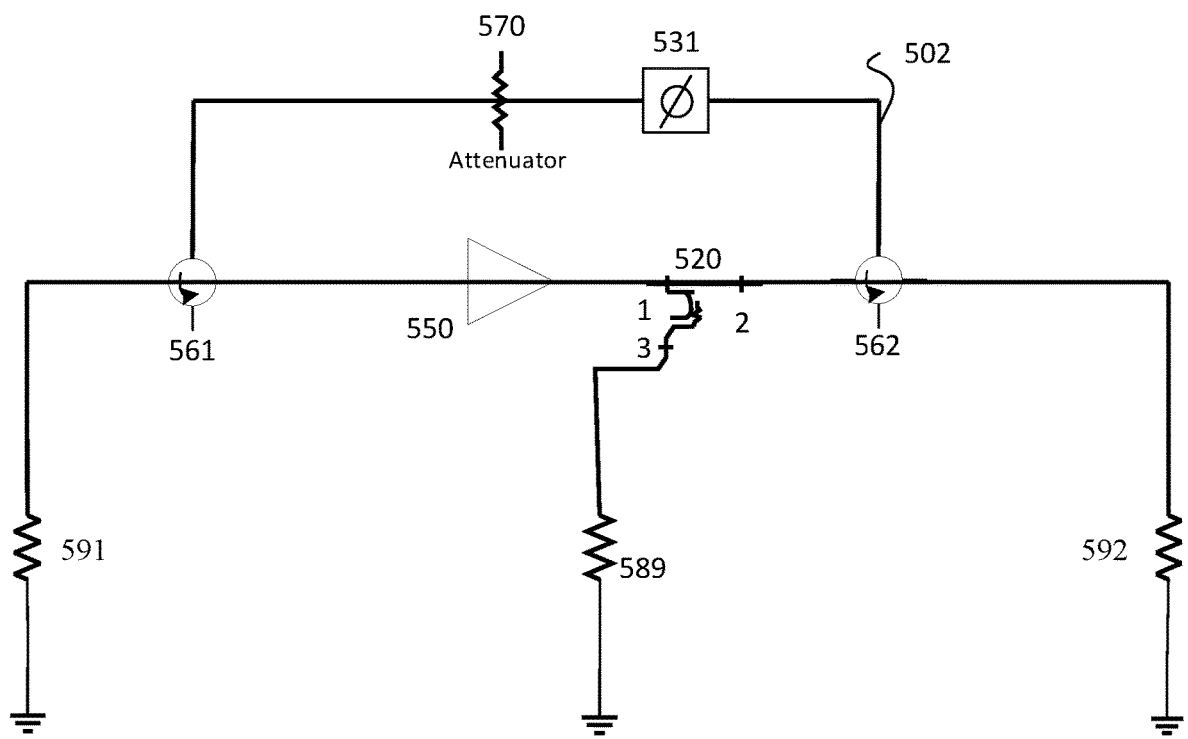
FIG. 5C illustrates a modelized cavity view of the oscillator circuit implementation in FIGS. 5A and 5B, in accordance with a representative embodiment.

FIG. 5C illustrates a modelized cavity view of the oscillator circuit implementation in FIGS. 5A and 5B, in accordance with a representative embodiment. In FIG. 5C, the cavity mode performance of the oscillator circuit implementation in FIGS. 5A and 5B will result effectively in a short circuit at high offset frequencies for the resonator. The resonator 510 acts as a short circuit which is modeled by the first resistor 591 and the second resistor 592 having low values such as 50 milli-Ohms, and thus it is easier to see how there would be low loss reflections from first resistor 591 and second resistor 592 which would lead to a strong negative feedback signal to the input of the first amplifier 550.

In FIG. 5C, the second loop 502 receives input from the second circulator 562 for signals at high offset frequencies that reflect from the second resistor 592 with the impedance of 50 milli-Ohms. There is a relatively low loss between the output of the first amplifier 550 and the second circulator 562 due to the high coupling value of 60 dB between port 1 and port 3 of the first coupler 520 leading to low loss in the through path from port 1 to port 2. The second circulator 562 and the first circulator 561, along with the phase shifter 531 and the attenuator 570, are used to provide negative feedback to the first amplifier 550. Accordingly, the modelized cavity view of FIG. 5C is an effective equivalent to for the high offset signal components in FIGS. 5A and 5B, and the oscillator circuit in FIG. 5C is therefore labelled as the same oscillator circuit 500A as in FIGS. 5A and 5B.

Figure 5D:
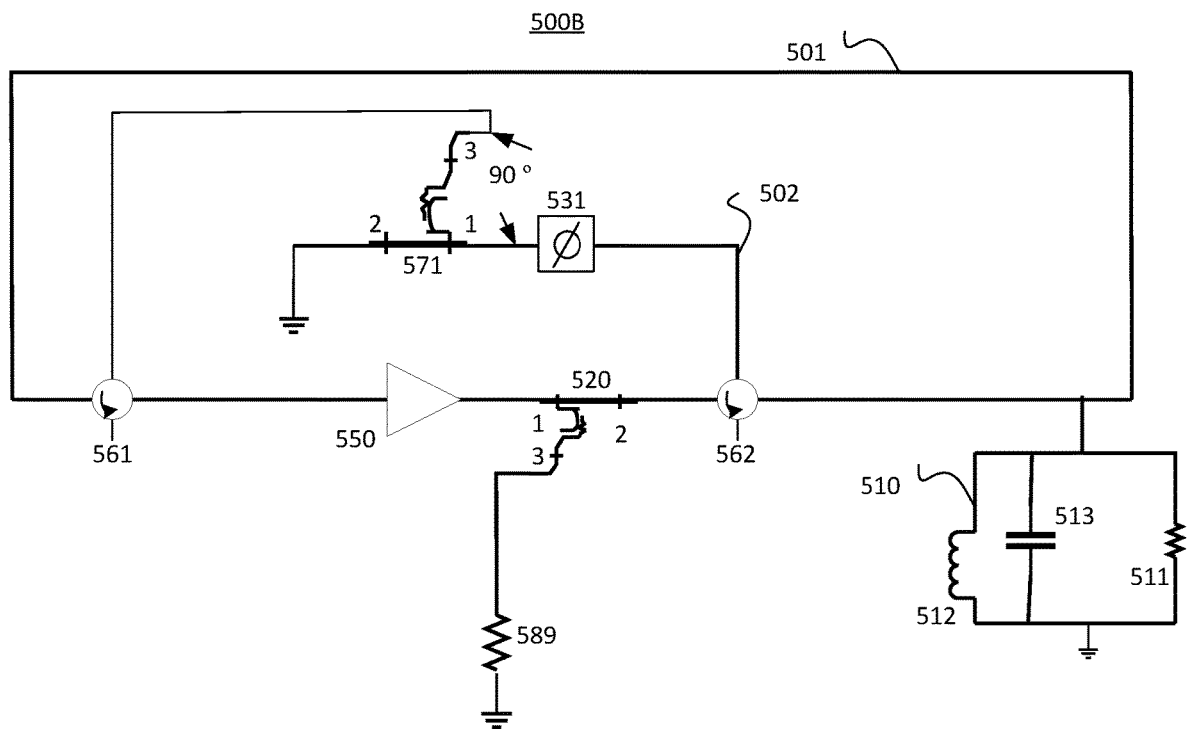
FIG. 5D illustrates a modified oscillator circuit implementation for a low phase noise oscillator using negative feedback in FIG. 5A, in accordance with a representative embodiment.

FIG. 5D illustrates a modified oscillator circuit implementation for a low phase noise oscillator using negative feedback, in accordance with a representative embodiment. In the embodiment of FIG. 5D, the attenuator 570 from FIGS. 5A and 5B is specified to be a coupler 571. The coupler 571 couples power from the second loop 502 to produce a 10 dB loss. The coupler 571 has an impedance of 50 Ohms. The coupler 571 also introduces a phase shift of 90° in the second loop 502.

Figure 5E:
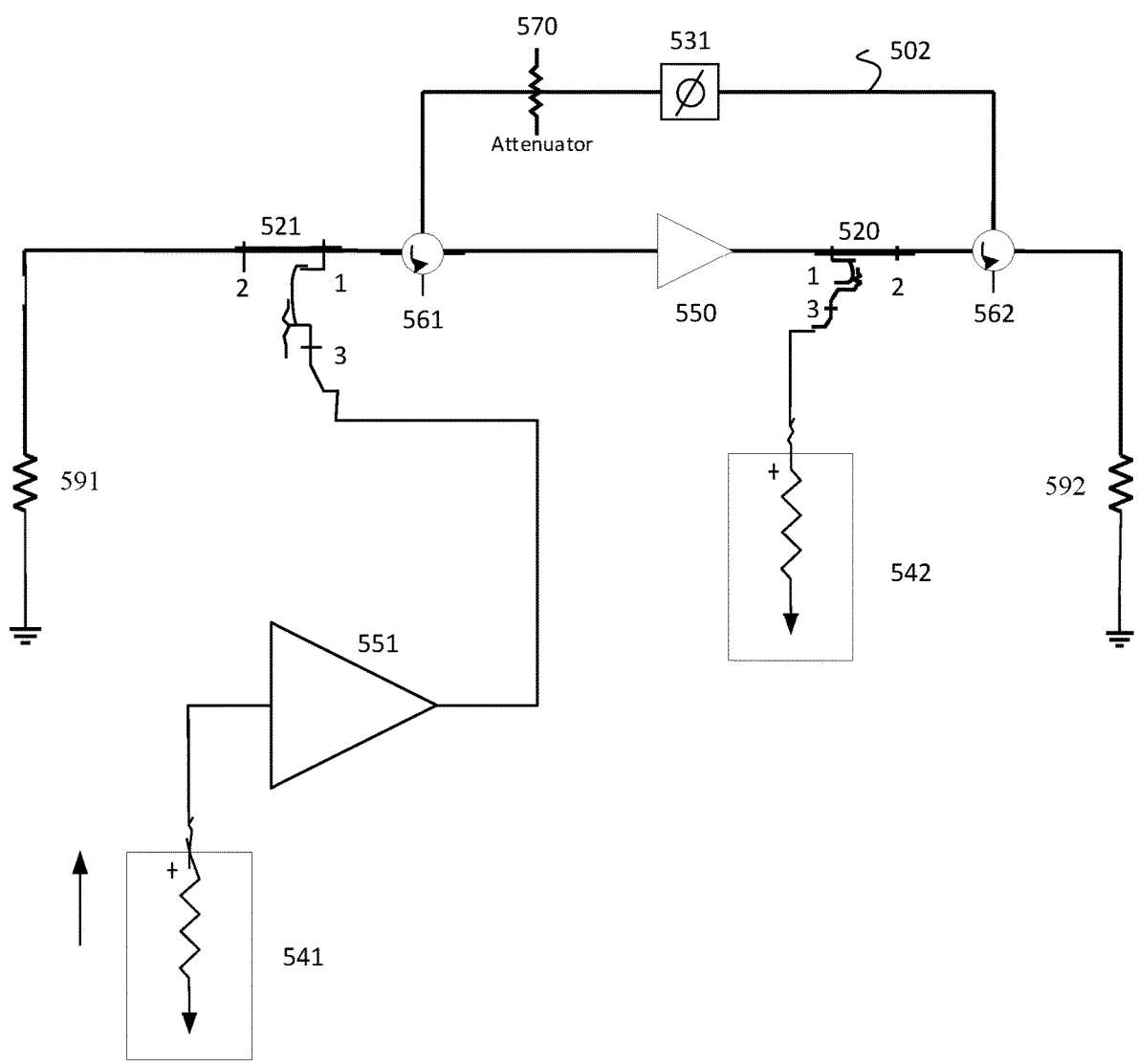
FIG. 5E illustrates a testing implementation for the oscillator circuit implementation in FIGS. 5A and 5B, in accordance with a representative embodiment.

FIG. 5E illustrates a testing implementation for the oscillator circuit implementation in FIGS. 5A and 5B, in accordance with a representative embodiment.

In the embodiment of FIG. 5E, an oscillator circuit 500C includes a first test port 541 is used to input a signal to the oscillator circuit implementation, and a second test port 542 is used to output a signal from the oscillator circuit implementation. The input signal from the first test port 541 is input to a second amplifier 551, and the output from the second amplifier 551 is primarily coupled by a second coupler 521 to the first circulator 561. The second test port 542 replaces the load 589 from FIGs. such as FIG. 5C and receives power output from the first amplifier 550 and coupled out by the first coupler 520.

In the embodiment of FIG. 5E, the first resistor 591 may have an impedance of 50 milli-Ohms and the second resistor 592 may have an impedance of 50 milli-Ohms. The first test port 541 couples power into the oscillator circuit 500C next to the first resistor 591 which serves as a 50 milli-Ohm termination as shown.

FIG. 6A illustrates an oscillator circuit implementation for a low phase noise oscillator using negative feedback, in accordance with a representative embodiment.

In FIG. 6A, the oscillator circuit 600A includes a resonator 610, a primary loop 601 and a secondary loop 602. The resonator 610 includes a resistor 611, an inductor 612, and a capacitor 613. The resistor 611, the inductor 612 and the capacitor 613 are provided in parallel in the resonator 610. The primary loop 601 is a first loop circuit and includes a first coupler 620, a second coupler 621, a third coupler 622, a resonator 610 and a first amplifier 650. The secondary loop 602 also includes the first coupler 620, the second coupler 621, the third coupler 622, the first amplifier 650, a phase shifter 631 and an attenuator 670. The first coupler 620 transfers some of the power output from the first amplifier 650 to the load 689 as an output power. The primary loop 601 may shift phase between −30° and +30° for a round trip of the primary loop 601.

As an example, the resistor 611 has a resistive value of 25 Ohms, the capacitor 613 has a capacitance of 8 μF (micro- Farads), and the inductor 612 has an inductance of 0.316629 pH (Pico-Henrys). The first coupler 620 has a loss of 6.00 dB from port 1 to port 3, the second coupler 621 has a loss of 6.00 dB from port 1 to port 3, and the third coupler 622 has a loss of 6.00 dB from port 1 to port 3. An output of the second coupler 621 has a fractional magnitude of an output of the first coupler 620, and as shown in the embodiment of FIG. 6A an output of the second coupler 621 may also have a fractional magnitude of an output of the third coupler 622.

The first coupler 620 has an impedance of 50 Ohms, the second coupler 621 has an impedance of 50 Ohms, and the third coupler 622 has an impedance of 50 Ohms. The first amplifier 650 has a primary gain of 16.00 dB and a phase shift of zero in the forward direction (S21), a gain of magnitude zero and a phase shift of zero for its input reflection coefficient (S11), a gain of magnitude zero and a phase shift of 180° for its output reflection coefficient (S22), and a gain of magnitude zero and a phase shift of zero for its reverse gain (S12). The first coupler 620 couples power from the signal incident at port 1 of the first coupler 620 to the signal that exits the port 3 of the first coupler 620 with a loss of 6.00 dB where it becomes signal C and is delivered to the load 689. The phase shifter 631 produces a 0° phase shift and has an impedance of 50 Ohms.

The resonator 610 is physically in the primary loop 601, but functionally part of both the primary loop 601 and the secondary loop 602 in that the resonator 610 is a key to making feedback in the secondary loop 602 work correctly. The resonator 610 has a much higher reflection for signals at frequencies highly offset from the center of resonance (carrier frequency), compared for example to signals at the center of resonance. With appropriate circuitry as in the oscillator circuit 600A, a much higher amount of negative feedback can be provided at these frequencies highly offsets from the center of resonance. This reduces magnitude of the highly offset signal components relative to the carrier frequency signal components, which improves the phase noise.

In other words, the primary loop 601 and the secondary loop 602 overlap, and even though the phase shifter 631 and the attenuator 670 are not in the primary loop 601 they contribute to the characteristics of the feedback to the first amplifier 650. Similarly, reflections from the resonator 610 contribute to the characteristics of the secondary loop 602, so that the resonator 610 is still functionally part of the secondary loop 602. The added components in the secondary loop 602 therefore work with components in the primary loop 601 including the resonator 610. The resonator 610 strongly reflects incident signal components at high offset frequencies and reflected signals output from the first amplifier 650 are partly coupled from port 1 of the third coupler 622 to port 3 of the third coupler 622 into the secondary loop 602.

The sum of phase shifts between the attenuator 670 and the phase shifter 631 may be nominally 0°, such as in the case as shown where each of the second coupler 621 and the third coupler 622 has a 90° phase shift. The attenuator 670 may have an attenuation that is time dependent but end up with a lower attenuation than at the start, anywhere down to and including 0 dB attenuation. Of course, the values of the oscillator circuit 600A may vary for different embodiments, such as to optimize performance depending on the high offset frequency response that is sought for the oscillator circuit 600A. Similar to the attenuator 570 described with respect to prior embodiments, the attenuator 670 may allow the negative feedback to be increased gradually so as to allow the secondary loop 602 with the second coupler 621 and the third coupler 622 to allow the use of high feedback without causing oscillations. This can improve stability of negative feedback by gradually decreasing the attenuation from an initially large amount. That is, a circuit such as the oscillator circuit 600A with the second coupler 621 and the third coupler 622 greatly improve phase noise insofar as the coupler circuits provide the most negative feedback. However, on the first cycle of the feedback, the feedback signal coming back to the input of the first amplifier 650 may be relatively large since there is no feedback for the first cycle, and this may create a ringing in the oscillator circuit 600A. Any such ringing can be avoided with a time dependent attenuation, so that initially the attenuator 770 is set to a high enough level that the oscillator circuit 600A is stable with feedback, and the output power for the noise is reduced somewhat. By reducing the noise output power, a higher level of feedback can be allowed without being unstable, and this leads to a lower output power for the noise again. As this process continues, eventually the attenuation can be set to 0 dB for maximum feedback, and maximum noise reduction. Therefore, the attenuator 670 in FIG. 5 may have an attenuation that varies over time, and may be, for example, a PIN diode attenuator. In the oscillator circuit 600A, negative feedback is produced at high offset frequencies that are highly offset from the center frequency of resonance so that the negative feedback is used to cancel input signal components at the high offset frequencies of the signal input to the first amplifier 550, effectively reducing phase noise and the phase noise floor at the high offset frequencies.

FIG. 6B includes the same oscillator circuit 600A as in FIG. 6A. Taken together, FIGS. 6A and 6B illustrate a signal flow that begins with the input to the first amplifier 650. The input to the first amplifier 650 is the first signal A, and the output from the first amplifier 650 is the second signal B. The power coupled from the output of the first amplifier 650 away from the primary loop 601 and the secondary loop 602 by the first coupler 620 is the third signal C, and the power that is passed through the first coupler 620 in the primary loop 601 and the secondary loop 602 is the fourth signal D. Signal D is output from port 2 of the first coupler 620 with a loss of 1.6 dB where it heads to the resonator 610 as signal E through the third coupler 622. Signal E at high offset frequencies is strongly reflected from the resonator 610 and becomes signal F, is reflected back towards the third coupler 622. Signal F is coupled 6.00 dB down from the primary loop 601 to the secondary loop 602 where it becomes signal G, where it heads to the phase shifter 631. After signal G proceeds through the phase shifter 631 and the attenuator 670 it becomes signal H and proceeds to port 3 of the second coupler 621. Signal H exits port 1 of the second coupler 621 as signal I1, heading clockwise on the primary loop 601 towards the resonator 610 as signal I2. At high offset frequencies, signal I2 is strongly reflected from the resonator 610, and becomes signal J1 which heads back counterclockwise on the primary loop 601 to the input of the first amplifier 650 where it provides feedback to the input of the first amplifier 650 as signal J2.

The signal flow illustrated in FIGS. 6A and 6B shows only a portion of the signals with different characteristics that are present in the oscillator circuit 600A. For example, the first signal A and the tenth signal J2 are both inputs to the first amplifier 650, and this reflects one aspect of the feedback characteristics of the oscillator circuit 600A insofar as the tenth signal J2 results from the first signal A. Additionally, signals may change each time they pass through or are reflected by any of the elements in the primary loop 601 or the secondary loop 602. For example, signals at frequencies at high offset frequencies that are highly offset from a carrier signal may be reflected by the resonator 610, and such signals may lose some power due to the reflection.

Figure 6C:
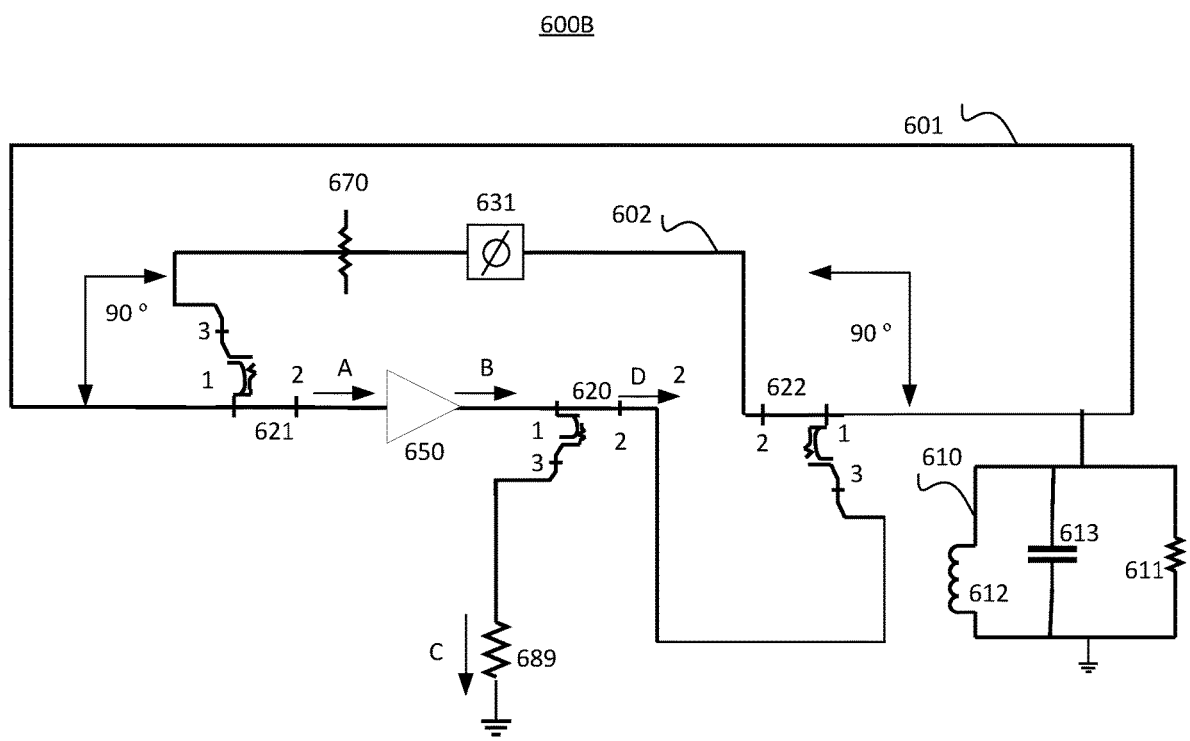
FIG. 6C illustrates another oscillator circuit implementation for a low phase noise oscillator using negative feedback, in accordance with a representative embodiment.

FIG. 6C illustrates another oscillator circuit implementation for a low phase noise oscillator using negative feedback, in accordance with a representative embodiment.

In FIG. 6C, the oscillator circuit 600B includes a resonator 610, a primary loop 601 and a secondary loop 602. The resonator 610 includes a resistor 611, an inductor 612, and a capacitor 613. The resistor 611, the inductor 612 and the capacitor 613 are provided in parallel in the resonator 610. The primary loop 601 includes a first coupler 620, a second coupler 621, a third coupler 622 and a first amplifier 650. The secondary loop 602 also includes the first coupler 620, the second coupler 621, the third coupler 622, the first amplifier 650, a phase shifter 631 and an attenuator 670. The first coupler 620 transfers some of the power output from the first amplifier 650 to the load 689 as an output power.

Figure 6D:
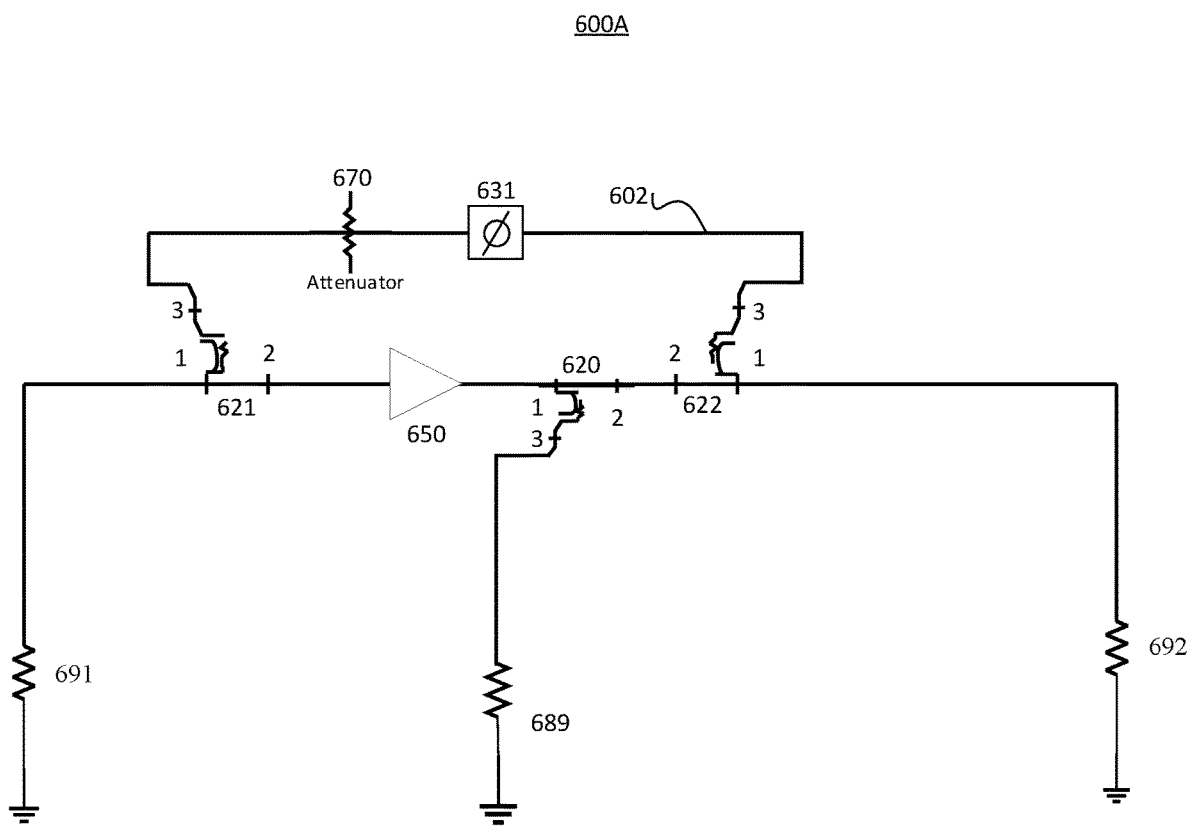
FIG. 6D illustrates a modelized cavity view of the oscillator circuit implementation in FIGS. 6A and 6B, in accordance with a representative embodiment.

Compared to the embodiment of FIGS. 6A and 6B, the third coupler 622 in the oscillator circuit 600B in FIG. 6C couples power incident on port 1 to the secondary loop 602 through port 2, and power incident on port 1 to the primary loop 601 through port 3. The oscillator circuit 600B in FIG. 6C provides for situations where the first amplifier 650 has excess gain and power to obtain higher amounts of reflected power into the feedback loop. For example, any high offset frequency portions of a signal incident from port 1 of the third coupler 622 to the resonator 610 will be reflected from the resonator 610 back to the third coupler 622. In the oscillator circuit 600B, the power coupled from port 1 to port 2 of the third coupler 622 will be fed to the secondary loop 602, whereas in the oscillator circuit 600A in FIGS. 6A and 6B the power coupled from port 1 to port 2 of the third coupler 622 will be fed back to the primary loop 601. The power fed to the secondary loop 602 may be the larger portion of the power incident on port 1 of the third coupler 622. FIG. 6D illustrates a modelized cavity view of the oscillator circuit implementation in FIGS. 6A and 6B, in accordance with a representative embodiment.

In FIG. 6D, the cavity mode performance of the oscillator circuit implementation in FIGS. 6A and 6B will result effectively in a short circuit at high offset frequencies. The resonator 610 acts as a short circuit which is modeled by the first resistor 691 and the second resistor 692 having low values such as 50 milli-Ohms, and thus it is easier to see how there would be low loss reflections from first resistor 691 and second resistor 692 which would lead to a strong negative feedback signal to the input of the first amplifier 650.

In FIG. 6D, the secondary loop 602 receives input from the third coupler 622 for signals at high offset frequencies that reflect from the second resistor 692 with the impedance of 50 milli-Ohms. There is a relatively low loss between the output of the first amplifier 650 and the third coupler 622 due to the coupling between port 1 and port 3 of the first coupler 620. The third coupler 622 and the second coupler 621, along with the phase shifter 631 and the attenuator 670, are used to provide negative feedback to the first amplifier 650. Accordingly, the modelized cavity view of FIG. 6D is an effective equivalent to for the high offset signal components in FIGS. 6A and 6B, and the oscillator circuit in FIG. 6D is therefore labelled as the same oscillator circuit 600A as in FIGS. 6A and 6D.

Figure 6E:
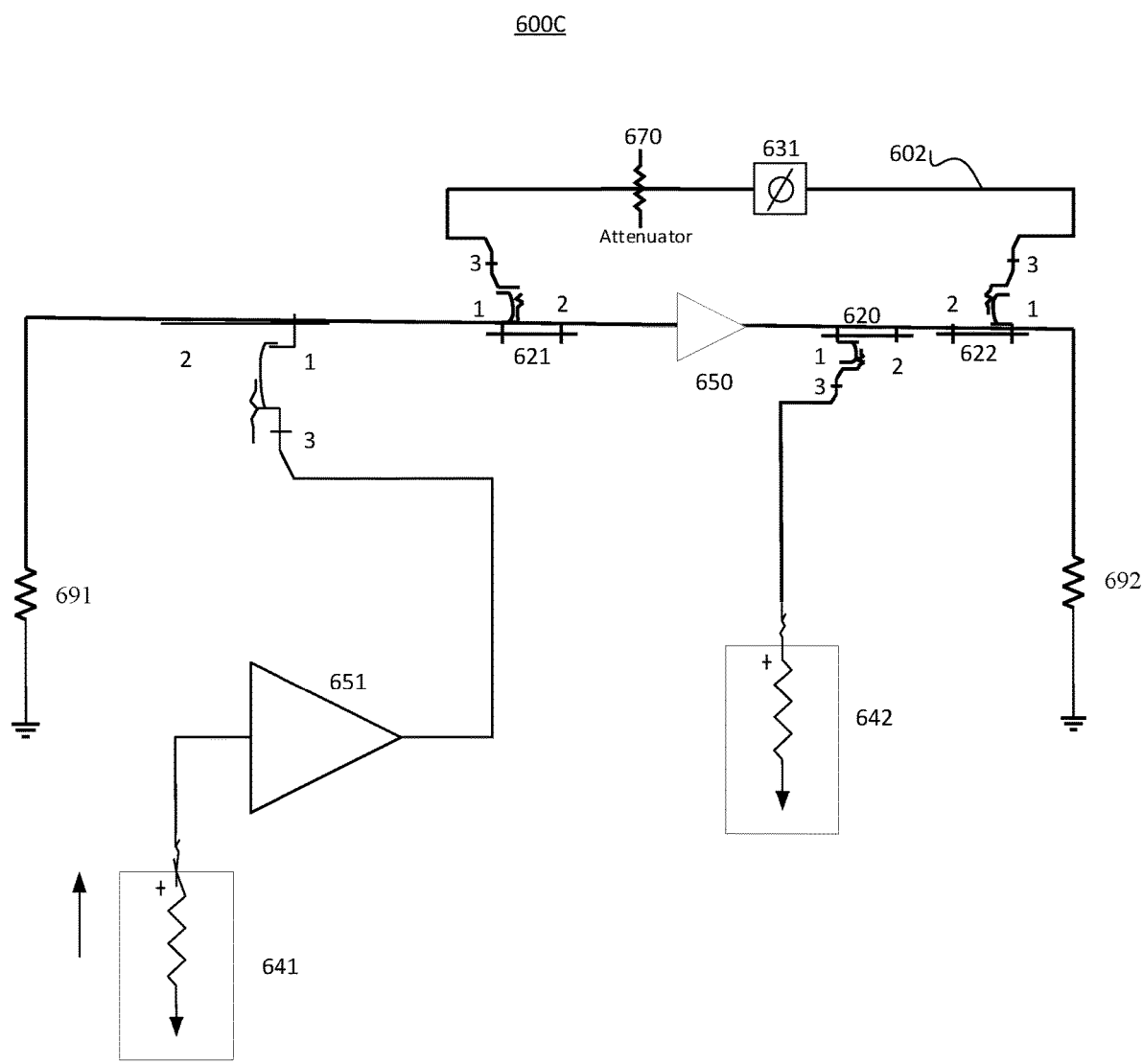
FIG. 6E illustrates a testing implementation for the oscillator circuit implementation in FIGS. 6A and 6B, in accordance with a representative embodiment.

FIG. 6E illustrates a testing implementation for the oscillator circuit implementation in FIGS. 6A and 6B, in accordance with a representative embodiment.

In the embodiment of FIG. 6E, a first test port 641 is used to input a signal to the oscillator circuit implementation of the oscillator circuit 600C, and a second test port 642 is used to output a signal from the oscillator circuit implementation of the oscillator circuit 600C. The input signal from the first test port 641 is input to a second amplifier 651, and the output from the second amplifier 651 is primarily coupled by a second coupler 621 to the first amplifier 650. The second test port 642 replaces the load 689 from FIGS. 6A and 6B and receives power output from the first amplifier 650 and coupled out by the first coupler 620.

In the embodiment of FIG. 6E, the first resistor 691 may have an impedance of 50 milli-Ohms and the second resistor 692 may have an impedance of 50 milli-Ohms. The first test port 641 couples power into the oscillator circuit 500D next to the first resistor 691 which serves as a 50 milli-Ohm termination as shown.

Figure 7A:
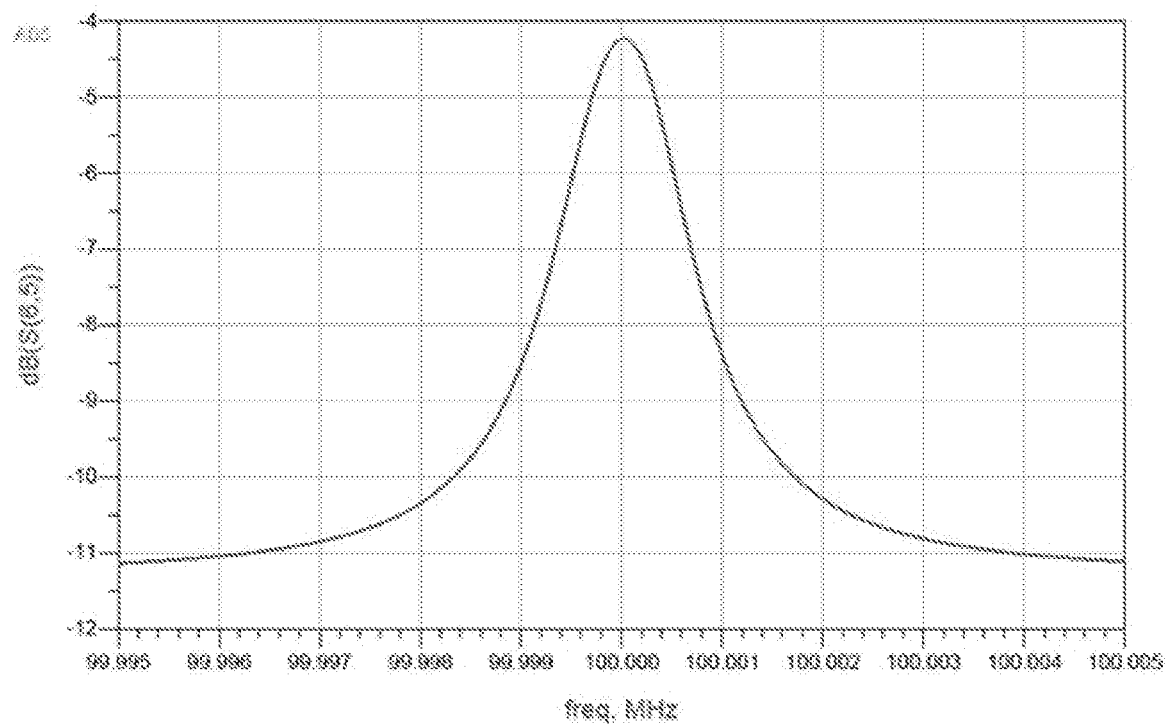
FIG. 7A illustrates a generalized plot of amplitude versus frequency for a low phase noise oscillator using negative feedback, in accordance with a representative embodiment.
Figure 7B:
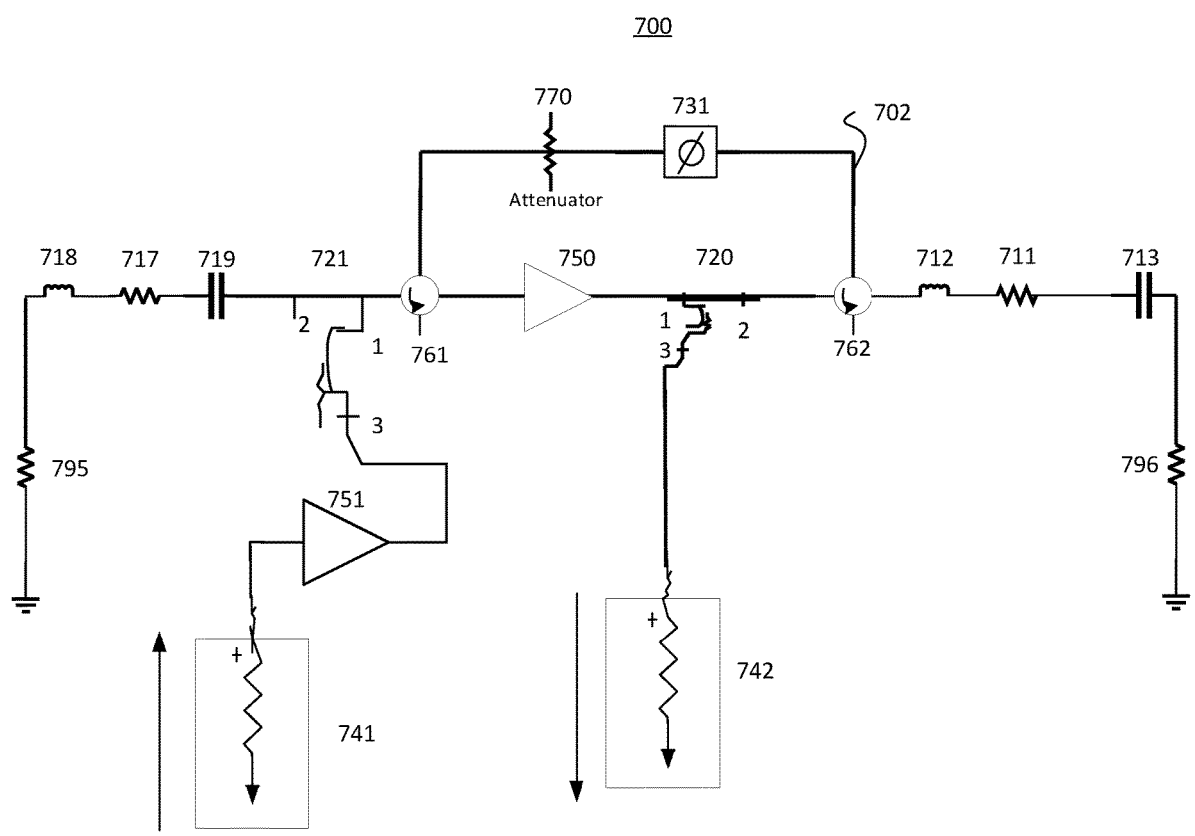
FIG. 7B illustrates an oscillator circuit implementation for a low phase noise oscillator using negative feedback that produces the generalized plot in FIG. 7A, in accordance with a representative embodiment.

FIG. 7A illustrates a generalized plot of amplitude versus frequency for an open loop model of a low phase noise oscillator using negative feedback, in accordance with a representative embodiment such as that shown in FIG. 7B.

In FIG. 7A, the Y axis shows losses for an open loop model of an oscillator circuit and the X axis shows frequencies of signals reflected in the losses. As shown, minimum losses are −4.00 dB towards 100 Megahertz compared to a similar oscillator such as one designed in accordance with Leeson's Rule with no negative feedback. This −4.00 dB loss is just an illustration of the loss at the center of resonance for a particular resonator configuration and is not linked to the −4.00 dB loss for a round trip of the cavity mode that has been previously discussed. Accordingly, if 100 Megahertz is the carrier signal of the oscillator circuit represented in FIG. 7, high offset frequencies that are highly offset from the carrier signal show significantly more losses than are present at the carrier signal.

FIG. 7B illustrates an oscillator circuit implementation for a low phase noise oscillator using negative feedback that produces the generalized plot in FIG. 7A, in accordance with a representative embodiment.

In FIG. 7B, the oscillator circuit 700 is a testing implementation with a first test port 741 for input and a second test port 742 for output. The only loop circuit shown is the loop circuit 702 which in similar configurations would be the second loop circuit. The loop circuit 702 includes a first circulator 761, a first amplifier 750, a first coupler 720, a second circulator 762, a phase shifter 731 and an attenuator 770. Resonator circuits are provided on the far left and the far right. A first resonator circuit includes a resistor 717, an inductor 718 and a capacitor 719, and is provided between the second coupler 721 and a resistor 795. A second resonator circuit includes a resistor 711, an inductor 712 and a capacitor 713, and is provided between the second circulator 762 and a resistor 796.

The input signal from the first test port 741 essentially passes through the second amplifier 751 and is coupled by the second coupler 721 from port 3 to port 1 to be circulated by the first circulator 761. The first circulator 761 provides the signal from the second coupler 721 as input to the first amplifier 750. Output from the first amplifier 750 is coupled by the first coupler 720 from port 1 to port 3 and then to the second test port 742 as output.

In FIG. 7B, the resistor 795 has a 50 Ohm impedance and the resistor 796 has a 50 Ohm impedance. The 50 Ohm terminations to ground show for the resistor 795 and the resistor 796 are representative of the 50 Ohm input and output impedances that would be typical for an amplifier.

As described above, negative feedback is produced at high offset frequencies that are highly offset from the center frequency of resonance in an oscillator circuit, such that the negative feedback is used to cancel input signal components at the high offset frequencies of the signal input to an amplifier, effectively reducing phase noise and the phase noise floor at the high offset frequencies. Accordingly, oscillator circuits are used to leverage resonators insofar as the resonators have different reflections for incident signal at the center frequency of resonance compared to high offset frequencies. The reflection at the center frequency of resonance is much less than the reflection at high offset frequencies. The stronger reflection for high offset frequencies can be and is leveraged to obtain a higher negative feedback signal at high offset frequencies compare to the center frequency of resonance. The negative feedback signal is used to reduce signal power at the high offset frequencies and hence improve phase noise at the high offset frequencies. Accordingly, low phase noise oscillator using negative feedback enables a significantly lower high offset phase noise and phase noise floor compared to a standalone amplifier. This in turn reflects an improvement (reduction) in phase noise, even when using the same resonators as used in known oscillators, and even when using amplifiers that dissipate a similar amount of power as other oscillators. The low phase noise oscillator using negative feedback described herein is a new class of oscillator that uses negative feedback in the cavity mode to provide lower phase noise, particularly at high offset frequencies. As described, high offset frequencies may be offset frequencies greater than $fo/2Q_L$, but this is more a convenient way of describing high offset frequencies than a necessary way. As described in the introduction, the Leeson class of oscillators provide no feedback to the amplifier in the cavity mode at any offsets, and their feedback in the loop feedback mode begins to decline quickly at offsets greater than $fo/2Q_L$, so as to be essentially negligible at offsets greater than $6fo/2Q_L$. Frequency offsets above $6fo/2Q_L$ will have an essentially lossless reflection, so that if the round trip through the cavity mode has less than 4.00 dB loss for those offsets, then this will allow the use of negative feedback that provides significantly improved phase noise to offsets of $fo/2Q_L$ and above.

Additionally, multiple example circuit topologies are described herein using negative feedback in the cavity mode, but these are not the only circuit topologies that can obtain the characteristic improvements described herein such as to reduce phase noise at offsets higher than +/−5 kHz for a high-quality quartz resonator used in a 100 MHz oscillator, or more generally, $\sim 6fo/2Q_L$. Circuits consistent with the descriptions herein will provide for an oscillator circuit with a round trip in the cavity mode at these offsets having relative magnitude of −4.00 dB or greater such as −3.00 dB, −2.00 dB etc. To reiterate the timing described earlier, when an oscillator circuit such as the oscillator circuit 500A or the oscillator circuit 600A is started, the largest signal at high offset frequencies will be for the first cycle of the oscillator circuit. Afterwards the feedback effects at high offset frequencies described herein will result in lower signals at high offset frequencies for cycles after the first cycle.

Although low phase noise oscillator using negative feedback has been described with reference to several exemplary embodiments, it is understood that the words that have been used are words of description and illustration, rather than words of limitation. Changes may be made within the purview of the appended claims, as presently stated and as amended, without departing from the scope and spirit of low phase noise oscillator using negative feedback in its aspects. Although low phase noise oscillator using negative feedback has been described with reference to particular means, materials and embodiments, low phase noise oscillator using negative feedback is not intended to be limited to the particulars disclosed; rather low phase noise oscillator using negative feedback extends to all functionally equivalent structures, methods, and uses such as are within the scope of the appended claims.

For example, the embodiments of FIGS. 5A to 5C and 6A to 6B are example circuits, but other circuits for a low phase noise oscillator using negative feedback may produce similar or even improved results in some respects. Circuits described herein include couplers and circulators as circuit elements, but other circuit elements may be used to perform similar functions. Similarly, in the embodiments of FIGS. 5A to 5C and 6A to 6B, the resonators 510 and 610 are merely illustrative examples, and other types of resonators may be used with the oscillator circuits for a low phase noise oscillator using negative feedback. Equivalent circuits to those shown in embodiments herein fall within the scope of the instant disclosure. For example, negative feedback from the signal K in FIG. 5A and signal J2 in FIG. 6B results from a particular arrangement of particular elements in order to offset the high offset frequency components of an input signal to an amplifier in these figures. However, other arrangements of other circuit elements may be used to obtain similar characteristic improvements using negative feedback, and will still fall within the scope of the low phase noise oscillator using negative feedback described herein.

As described above, the improvement in phase noise achieved by the low phase noise oscillator using negative feedback will vary depending on whether the oscillator circuit uses circulators or couplers, settings for attenuation and phase shift in the feedback path, and other factors. However, improvements such as that shown in FIG. 7A are achievable, and these improvements can include 4.00 dB additional loss at the center frequency of resonance, and 11.00 dB or more of additional loss at high offset frequencies. Accordingly, even if 4.00 dB gain is added to compensate for the excess loss at the center frequency of resonance, 7.00 dB or more in improvement for phase noise at high offset frequencies is still possible. As a result, the low phase noise oscillator using negative feedback will lower the gain at the resonant frequency and will lower the phase noise slightly near the resonant frequency, but will also lower the gain, phase noise floor and phase noise to a much greater degree at high offset frequencies away from the resonant frequency.

The illustrations of the embodiments described herein are intended to provide a general understanding of the structure of the various embodiments. The illustrations are not intended to serve as a complete description of all of the elements and features of the disclosure described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The Abstract of the Disclosure is provided to comply with 37 C.F.R. § 1.72(b) and is submitted with the understanding that it will not be used to interpret or limit the scope or meaning of the claims. In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The preceding description of the disclosed embodiments is provided to enable any person skilled in the art to practice the concepts described in the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

The invention claimed is:

1. An oscillator, comprising:
a resonator; and
a first loop circuit that includes an amplifier and a first coupler, and that is electrically coupled to the resonator, wherein the oscillator is configured to produce negative feedback for the amplifier in a cavity mode relative to short circuit terminations or open circuit terminations of a cavity modelling the oscillator at frequencies offset from a carrier frequency, and wherein the oscillator has a loss of less than 4.00 dB for a bidirectional trip through the cavity at the frequencies offset from the carrier frequency.

2. The oscillator of claim 1, further comprising:
a second loop circuit at least partly overlapping the first loop circuit and comprising at least one circuit component between an input of the resonator and an output of the resonator, wherein the second loop circuit provides a feedback signal to the amplifier of magnitude greater than −4.00 dB relative to an original signal provided to the amplifier at frequencies offset from the carrier frequency.

3. The oscillator of claim 1, further comprising:
a second loop circuit between an input of the resonator and an output of the resonator, and that includes the amplifier, the first coupler, a first circulator, a phase shifter, an attenuator, and a second circulator; and
the frequencies offset from the carrier frequency are high offset frequencies, wherein the first circulator controls direction of a signal flow from an output of the first coupler to the resonator, wherein at the frequencies offset from the carrier frequency the signal flow is reflected back to the first circulator which transfers the signal flow towards the phase shifter, the attenuator and the second circulator,
the second circulator controls direction of the signal flow from the phase shifter and the attenuator to the resonator, wherein at the frequencies offset from the carrier frequency the signal flow is reflected to return to the first circulator and routed as input to the amplifier, and
the second loop circuit provides a negative feedback signal of magnitude greater than −4.00 dB relative to an original signal provided to the amplifier at the frequencies offset from the carrier frequency.

4. The oscillator of claim 3, wherein the attenuator comprises a second coupler and a resistor between the second coupler and ground.

5. The oscillator of claim 1, further comprising:
a second loop circuit that includes the amplifier, the first coupler, a second coupler and a third coupler, wherein:
the frequencies offset from the carrier frequency are high offset frequencies;
the second coupler couples a signal flow reflected from the resonator to be input to an attenuator and then a phase shifter, wherein the signal flow is input to the third coupler and output from the third coupler towards the resonator, wherein at the frequencies offset from the carrier frequency the signal flow is reflected towards the amplifier via the third coupler; and
the second loop circuit provides a negative feedback signal of magnitude greater than −4.00 dB relative to an original signal input to the amplifier at the frequencies offset from the carrier frequency.

6. The oscillator of claim 1, wherein the first loop circuit shifts phase between −30 degrees and +30 degrees for a round trip of the first loop circuit.

7. The oscillator of claim 1, wherein a second loop circuit implements the cavity mode with negative feedback for the oscillator.

8. The oscillator of claim 1, wherein the negative feedback is based on coupling an output of the amplifier which has passed through a main path of the first coupler and reflected off the resonator, and passed through a coupled path of a third coupler, a phase shifter, an attenuator, a coupled path of a second coupler, and towards the resonator and, at high offset frequencies, reflected to pass through a main path of the second coupler as feedback to the amplifier, wherein the output of the amplifier is fed back to the amplifier through a combination of reflections off the resonator in the first loop circuit.

9. The oscillator of claim 8, wherein a second loop circuit comprises the second coupler, and an output of the second coupler has a fractional magnitude of an output of the first coupler and is fed back to the amplifier.

10. The oscillator of claim 1, wherein the cavity mode is produced by the oscillator by reflecting an output of the amplifier from the resonator.

11. The oscillator of claim 1, wherein the cavity mode is produced by the oscillator at the frequencies offset from the carrier frequency by reflecting an output of the amplifier from the resonator at the frequencies offset from the carrier frequency.

12. The oscillator of claim 1, wherein the frequencies offset from the carrier frequency are greater than +/−5 kHz.

13. An oscillator, comprising:
a resonator;

a first loop circuit that includes an amplifier and a first coupler, and that is electrically coupled to the resonator; and a second loop circuit that produces negative feedback for the amplifier, wherein the oscillator is configured to produce negative feedback for the amplifier in a cavity mode relative to short circuit terminations or open circuit terminations of a cavity modelling the oscillator at frequencies offset from a carrier frequency, and wherein the oscillator has a loss of less than 4.00 dB for a bidirectional trip through the cavity at the frequencies offset from the carrier frequency.

14. The oscillator of claim 13, wherein the second loop circuit provides a feedback signal to the amplifier with a magnitude greater than −4.00 dB relative to an original signal provided to the amplifier at the frequencies offset from the carrier frequency.

15. The oscillator of claim 13, wherein the second loop circuit includes the amplifier, the first coupler, a first circulator, a phase shifter, an attenuator, and a second circulator, signal flow reflected from the resonator is directed by the first circulator to the phase shifter, the attenuator, and the second circulator, signal from the phase shifter and the attenuator is directed by the second circulator to the resonator which reflects the signal flow to return to the second circulator, and then to the amplifier, and the second loop circuit provides a feedback signal of magnitude greater than −4.00 dB relative to an original signal provided to the amplifier for the frequencies offset from the carrier frequency.

16. The oscillator of claim 13, further comprising:

a second loop circuit that includes the amplifier, the first coupler, a second coupler, a phase shifter, an attenuator and a third coupler, wherein the second coupler couples a signal reflected from the resonator to the phase shifter, the attenuator, the third coupler and then the resonator which reflects the signal at the frequencies offset from the carrier frequency back to the third coupler, and the signal from the third coupler is provided to the amplifier as negative feedback with a signal of magnitude greater than −4.00 dB relative to an original signal provided to the amplifier for the frequencies offset from the carrier frequency.

17. The oscillator of claim 13, wherein the second loop circuit implements a cavity mode with negative feedback for the oscillator.

18. The oscillator of claim 13, wherein the negative feedback is based on coupling an output of the amplifier through the first coupler to produce an output of the first coupler that reflects from the resonator and is coupled with a fractional magnitude of a reflection of the resonator that is fed back to the amplifier, the output of the amplifier is fed back to the amplifier through the second loop circuit, the second loop circuit comprises a second coupler, and an output of the second coupler has a fractional magnitude of the output of the first coupler and is fed back to the amplifier.

19. The oscillator of claim 13, wherein the cavity mode is produced by the oscillator at the frequencies offset from the carrier frequency by reflecting an output of the amplifier from the resonator at the frequencies offset from the carrier frequency.

20. The oscillator of claim 13, further comprising:

an attenuator that varies attenuation as a function of time to stabilize the second loop circuit.

* * * * *